(12) United States Patent
Itakura et al.

(10) Patent No.: US 6,480,178 B1
(45) Date of Patent: Nov. 12, 2002

(54) AMPLIFIER CIRCUIT AND LIQUID-CRYSTAL DISPLAY UNIT USING THE SAME

(75) Inventors: Tetsuro Itakura, Tokyo; Takeshi Shima, Sagamihara, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/128,414

(22) Filed: Aug. 4, 1998

(30) Foreign Application Priority Data

Aug. 5, 1997 (JP) .............................. 9-210549

(51) Int. Cl.[7] .................. G09G 3/36; H03E 3/217; H03E 3/45; H03E 3/04; H03E 21/00
(52) U.S. Cl. .................. 345/89; 330/1; 330/251; 330/252; 330/253; 330/255; 330/288
(58) Field of Search ................. 330/288, 1 R, 330/255, 251–253; 345/89

(56) References Cited

U.S. PATENT DOCUMENTS

| | | | | |
|---|---|---|---|---|
| 5,283,477 A | * | 2/1994 | Shibata | 330/255 |
| 5,739,803 A | * | 4/1998 | Neugebauer | 345/98 |
| 5,850,139 A | * | 12/1998 | Edwards | 323/280 |
| 5,854,574 A | * | 12/1998 | Singer et al. | 330/253 |
| 5,900,783 A | * | 5/1999 | Dasgupta | 330/255 |
| 5,909,146 A | * | 6/1999 | Okada | 330/255 |

FOREIGN PATENT DOCUMENTS

| | | |
|---|---|---|
| JP | 64-54803 | 3/1989 |
| JP | 4-130807 | 5/1992 |
| JP | 9-98073 | 4/1997 |

OTHER PUBLICATIONS

Paul R. Gray, et al., "Analysis and Design of Analog Integrated Circuits," 2nd Edition, Chapter 12, Sec. 12.4.2, (1984), pp. 741–750.

* cited by examiner

Primary Examiner—Ulka J. Chauhan
Assistant Examiner—Duc Q Dinh
(74) Attorney, Agent, or Firm—Oblon, Spivak, McClelland, Maier & Neustadt, P.C.

(57) ABSTRACT

An amplifier circuit comprising an input stage and an output stage which are cascade-connected between a signal input terminal to which an input signal is input and a signal output terminal to which a capacitive load is connected and which includes at least an input amplification stage and an output amplification stage, and a resistor circuit including at least a resistor inserted between the output terminal of the output amplification stage and the signal output terminal.

13 Claims, 20 Drawing Sheets

AMPLIFIER CIRCUIT AND LIQUID-CRYSTAL DISPLAY UNIT USING THE SAME

BACKGROUND OF THE INVENTION

This invention relates to an amplifier circuit for driving a capacitive load according to an input signal voltage varying at, for example, specific intervals of time and a liquid-crystal display unit using the amplifier circuit, and more particularly to a small-size, low-power-consumption amplifier circuit suitable for integration.

A liquid-crystal display unit is generally comprises a liquid-crystal display panel, a liquid-crystal display driving circuit for driving the liquid-crystal display panel by supplying image signals to the signal lines, and a scanning line selector circuit for selectively driving the scanning lines. In the liquid-crystal display panel, liquid-crystal cells are arranged in a matrix. Also in the panel, signal lines to which image signals are supplied and scanning lines are provided in such a manner that the former intersect the latter.

An amplifier circuit in a voltage follower configuration was used in the signal-line drive circuit of the liquid-crystal display drive circuit in the liquid-crystal display unit. Since the gain A of the amplifier circuit is finite, the error difference between the input and output of the voltage follower configuration is expressed by 1/A of the input voltage. To decrease the difference, an amplifier circuit in a two-stage configuration was used. Specifically, the amplifier circuit includes an input amplifier stage and an output amplifier stage with a phase compensation capacitor Cf.

With this configuration, when a load capacitor connected to the output amplification stage is large, the phase compensation capacitance has to be made as large as, for example, 3 to 5 pF, to operate the amplifier circuit stably with less power consumption. In addition, the transconductance at the second amplification stage has to be made high by making the bias current larger. As a result, when a drive circuit including, for example, 300 units of the amplifier circuit is integrated, a total of 900 to 1500 pF is required because a phase compensation capacitor Cf of 3 to 5 pF is needed for each amplifier circuit. This causes the problem of making the chip area very large. Another problem is that the drawn current is increased to make the operation stable.

As described above, in the case of amplifier circuits connected to large capacitive loads, the conventional method of stabilizing the amplifier circuits by phase compensation capacitances had disadvantages in that the sum total of phase compensation capacitances needed in integrating amplifier circuits became very large and therefore the chip area increased, leading to a rise in cost. Another problem was that the drawn current increased.

BRIEF SUMMARY OF THE INVENTION

The object of the present invention is to provide an amplifier circuit which not only reduces the chip area by either eliminating a phase compensation capacitance for stabilization or decreasing the capacitance considerably and operates stably but also decreases the drawn current.

According to the present invention, there is provided an amplifier circuit comprising: a plurality of amplification stages which are cascade-connected between a signal input terminal and a signal output terminal to which a capacitive load is connected and which includes at least an input amplification stage and an output amplification stage; and a resistor circuit including at least a resistor inserted between the output terminal of the output amplification stage and the signal output terminal.

The resistor circuit includes a plurality of resistors. At least one selected from the resistors is connected between the output amplification stage and the signal output terminal. Alternatively, the resistor circuit includes a plurality of resistors and switches. The resistance of the resistor circuit is set by the turning on and off of the switches. Furthermore, the resistor circuit may be comprised of the on resistance of a field-effect transistor.

In the invention, there is provided a feedback loop for applying feedback from the output terminal of the output amplification stage to the input terminal of the input amplification stage. The amplifier circuit is constructed in voltage follower configuration.

With the amplifier circuit of the above configuration, it is desirable that the frequency of a second pole appearing in an open loop frequency characteristic of the amplifier circuit should be lower than the frequency (unity gain frequency) at which the gain of the amplifier circuit is 1 and the frequency of a first zero in the open loop frequency characteristic should be set lower than the frequency at which the gain of the amplifier circuit is 1.

Furthermore, a capacitance (phase compensation capacitance) may be provided between the input and output terminals of the output amplification stage to stabilize the operation when, for example, the signal output terminal is disconnected from the capacitive load in the input offset voltage mode and the load capacitor becomes smaller equivalently.

With an amplifier circuit of the present invention, the resistive component of the resistor circuit forms a first zero with the capacitive component of the capacitive load inserted between the output terminal of the output amplification stage and the signal output terminal in the open loop frequency characteristic of the amplifier circuit. The advance of the phase at the zero compensates for a delay in the phase caused by the pole at the output amplification stage. Specifically, because the phase margin, a difference of −180° from the phase in which the gain is 1, can be made large, a phase compensation capacitance for stabilizing the operation of the amplifier circuit is not necessary. Even when a phase compensation capacitance is needed, it value may be very small. This helps not only decrease the chip area needed to form a phase compensation capacitance but also reduce the drawn current.

In the amplifier circuit of the invention, when an input signal voltage changing at specific intervals of time is inputted to the signal input terminal, it is desirable that the time constant determined by the resistor circuit and the capacitive component of the capacitive load should be set at more than zero and not more than ⅕ of the specific interval. In this case, the resistance of the resistor circuit should be more than zero and not more than 50 kΩ.

The amplifier circuit of the invention may further comprises a control section for sensing that the input signal voltage inputted to the signal input terminal has changed to a specific polarity and controlling a bias current to the output amplification stage.

The present invention may be applied to a two-input amplifier circuit including a positive-side amplifier-circuit and a negative-side amplifier circuit to which a first and a second input signal changing to the positive side and negative side with respect to a specific common voltage are inputted.

According to a preferred mode of the two-input amplifier circuit, the positive-side amplifier circuit comprises a first differential transistor pair to which the first input signal is inputted, a first current source for supplying a tail current to the first differential transistor pair, a first current mirror circuit whose current input terminal and current output terminal are connected to the two output terminals of the first differential transistor pair, and a first switch provided between the two output terminals of the first differential transistor pair, and the negative-side amplifier circuit comprises a second differential transistor pair to which the second input signal is inputted, a second current source for supplying a tail current to the second differential transistor pair, a second current mirror circuit whose current input terminal and current output terminal are connected to the two output terminals of the second differential transistor pair, and a second switch provided between the two output terminals of the second differential transistor pair, wherein the first switch is brought into the off state and the second switch is brought into the on state when the first input signal is inputted to the positive-side amplifier circuit, and the first switch is brought into the on state and the second switch is brought into the off state when the second input signal is inputted to the negative-side amplifier circuit.

The output amplification stage includes a complementary transistor pair whose drains or collectors are connected to the output terminal of the output amplification stage, the gate or base of one of the complementary transistor pair being connected to one output terminal of the positive-side amplifier circuit and the gate or base of the other of the complementary transistor pair being connected to one output terminal of the negative-side amplifier circuit.

The two-input amplifier circuit requires no phase compensation capacitance or a very small capacitance. In addition, the bias current to the output amplification stage can be set easily by short-circuiting the output terminals of the differential transistor circuit in the inactive one of the positive-side and negative-side amplifier circuits.

Furthermore, in another mode of the two-input amplifier circuit, the positive-side amplifier circuit and negative-side amplifier circuit further include a third and a fourth switch for turning on and off the first and second current sources, respectively, wherein a second current output terminal of the first current mirror circuit is connected via a fifth switch to the current input terminal of the second current mirror circuit and a second current output terminal of the second current mirror circuit is connected via a sixth switch to the current input terminal of the first current mirror circuit, and the first, fourth, and sixth switches are brought into the off state and the second, third, and fifth switches are brought into the on state when the first input signal is inputted to the positive-side amplifier circuit, and the first, fourth, and sixth switches are brought into the on state and the second, third, and fifth switches are brought into the off state when the second input signal is inputted to the negative-side amplifier circuit. This configuration enables still less power consumption.

In a liquid-crystal display unit comprising a liquid-crystal display including pixels, signal lines for selectively applying a signal voltage according to an image signal to each of the pixels, and scanning lines intersecting the signal lines, a driving circuit for driving the signal lines according to an image signal, and a selector circuit for selecting the scanning lines in sequence, the amplifier circuit of the invention is suited to be the amplifier circuit in the driving circuit.

According to the invention, there is provided a liquid-crystal display unit comprising a liquid-crystal display including pixels, signal lines for selectively applying a signal voltage according to an image signal to each of the pixels, and scanning lines intersecting the signal lines; a driving circuit for driving the signal lines according to an image signal; and a selector circuit for selecting the scanning lines in sequence, wherein the driving circuit includes an amplifier circuit comprising amplification stages which are cascade-connected between a signal input terminal to which an input signal is supplied and a signal output terminal to which a capacitive load is connected and that includes at least an input amplification stage and an output amplification stage, and a resistor circuit including at least a resistor inserted between the output terminal of the output amplification stage and the signal output terminal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, referring to the accompanying drawings, embodiments of the present invention will be explained.

Figure 1:
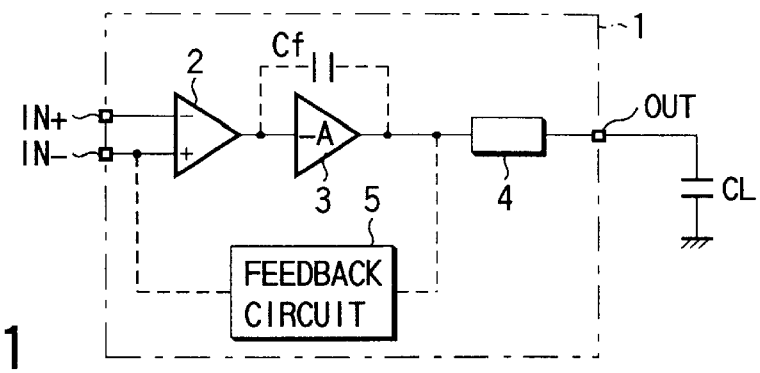
FIG. 1 shows the basic configuration of an amplifier circuit according to an embodiment of the present invention.

FIG. 1 shows the basic configuration of an amplifier circuit according to a first embodiment of the present invention. The amplifier circuit 1 amplifies a difference input signal supplied across a pair of signal input terminals IN+ and IN− and outputs the amplified signal at a signal output terminal OUT. The amplifier circuit 1 is comprised of an input amplification stage 2 and an output amplification stage 3 for further amplifying the output of the input amplification stage 2, the stage 2 being cascade-connected with the stage 3. A resistor circuit 4 of the present invention is inserted between the output terminal of the output amplification stage 3 and the signal output terminal OUT of the amplifier circuit 1.

As the need arises, there is provided a feedback circuit 5 for applying feedback from the output terminal of the output amplification stage 3 to the input terminal (signal input terminal IN−) of the input amplification stage 2. Moreover, as the occasion demands, a feedback circuit containing a vary small phase compensation capacitor Cf may be inserted between the input and output terminals of the output amplification stage 3.

Next, the operation of the amplifier circuit 1 of FIG. 1 will be explained.

Figure 2:
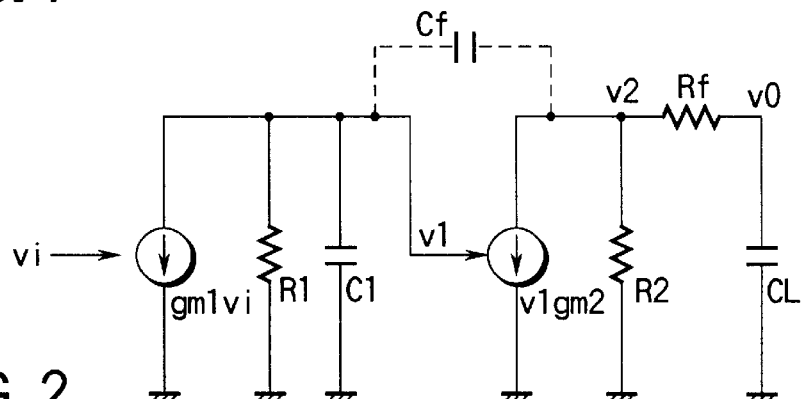
FIG. 2 shows an equivalent circuit of the amplifier circuit of FIG. 1.

FIG. 2 shows an equivalent circuit of the amplifier circuit 1. In FIG. 2, gm1 indicates the transconductance of the input amplification stage 2, R1 the parallel combined resistance of the output resistance of the input amplification stage 2 and the input resistance of the output amplification stage 3, C1 the capacitive component at the output terminal of the input amplification stage 2, gm2 the transconductance of the output amplification stage 3, R2 the output resistance of the output amplification stage 3, Rf the resistive component of the resistor circuit 4, and CL a load capacitor. Furthermore, vi indicates the input signal voltage to the signal input terminals IN+ and IN−, v1 the output voltage of the input amplification stage 2, v2 the output voltage of the output amplification stage 3, and vo the output signal voltage to the signal output terminal OUT.

In the amplifier circuit of FIG. 1, the frequency of a second pole appearing in its open loop frequency characteristic is lower than the frequency at which the gain of the amplifier circuit 1 is one and the resistor circuit 4 is inserted between the output terminal of the output amplification stage 3 and the signal output terminal OUT. This makes it possible to introduce a first zero into the open loop frequency characteristic. Specifically, from the transfer characteristic of the input signal voltage v1 to the output voltage v2 derived using the equivalent circuit of FIG. 2, the first and second poles and the first zero are determined as follows:

The first pole frequency (rad/sec):1/((R 2+Rf)CL)

wherein since R2>>Rf, the right term approximates 1/(R2·CL).

The second pole frequency (rad/sec):1/(R1·C1).

The first zero frequency (rad/sec):1/(Rf·CL).

Figure 3A:
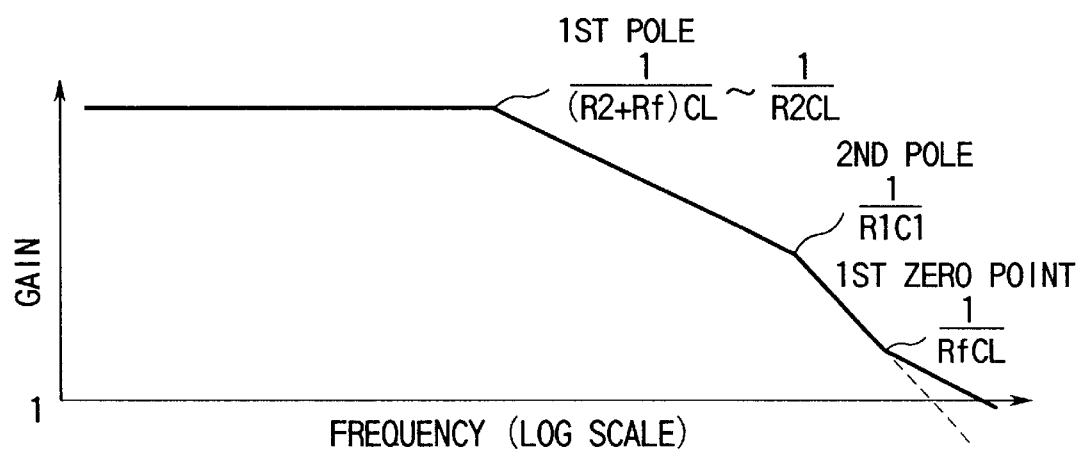
FIGS. 3A and 3B show a gain and a phase frequency characteristic of the amplifier circuit of FIG. 1.
Figure 3B:
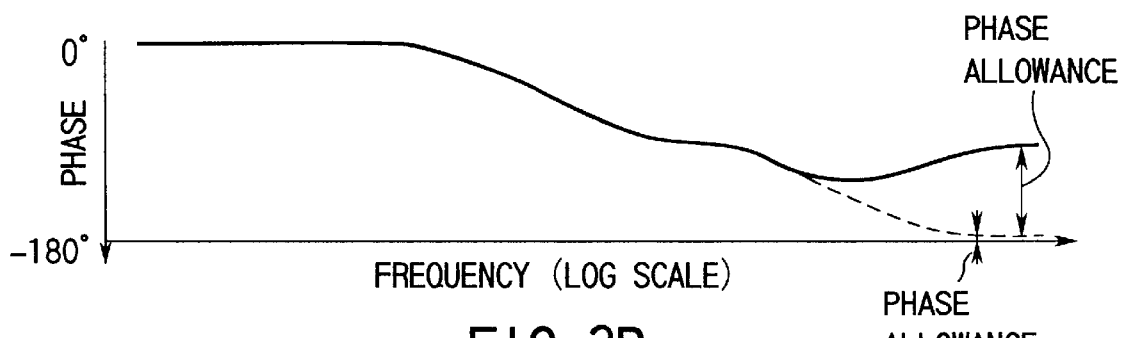

FIGS. 3A and 3B show an amplitude open loop frequency and a phase open loop frequency characteristic, respectively, with the resistor circuit 4. For the sake of comparison, a broken line in each of FIGS. 3A and 3B shows an open loop frequency characteristic without the resistor circuit 4 (Rf=0). As shown in FIG. 3B, the phase delayed at the first and second poles can be advanced by the zero formed by the resistor circuit 4 of the present invention, which improves the phase margin. This eliminates the need for a phase compensation capacitance needed in the prior art to stabilize the operation of the amplifier circuit 1, which makes it possible to reduce the chip area needed to form a phase compensation capacitance.

In conventional phase compensation, since the second pole frequency approximated gm2/CL for a large capacitive load, the phase margin could be improved by increasing the current at the output amplification stage. This, however, resulted in an increase in the power consumption. In contrast, with the present invention, because the transconductance itself has no direct relation with the frequency of the pole, phase compensation can be performed consuming low power.

Figure 4A:
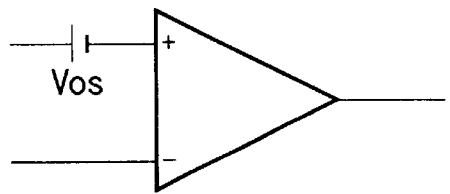
FIGS. 4A and 4B are diagrams to help explain an input offset for the amplifier circuit.
Figure 4B:
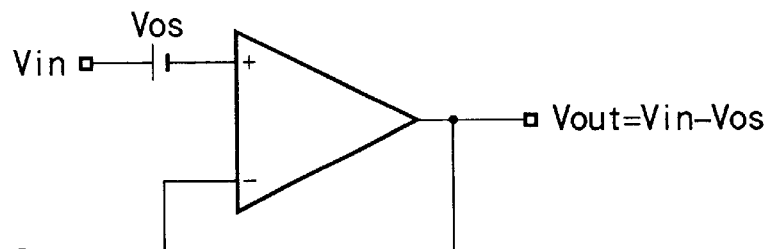

As described above, although the amplifier circuit of the present invention basically needs no phase compensation capacitance, a very small phase compensation capacitor Cf may be added to the amplifier circuit 1 as explained below. The amplifier circuit 1 generally has an input offset voltage (Vos). The input offset voltage Vos can be modeled into, for example, an amplifier circuit with no offset to one of whose inputs (here, the noninverting input) a voltage source equivalent to the input offset voltage Vos is connected as shown in FIG. 4A. When the amplifier circuit with negative feedback is used in a voltage follower configuration as shown in FIG. 4B, a voltage obtained by offsetting the input signal voltage Vin by a voltage equal to the input offset voltage Vos is outputted as the output signal voltage Vout.

To cancel the input offset voltage Vos, a conventional method was as follows. As shown in FIG. 5, a capacitance Ch and switches SW1 to SW3 were used. The SW1 and SW3 were closed and the SW2 was opened to cause the amplifier circuit to take a voltage follower configuration, which allowed the input offset voltage Vos to be applied to the capacitance Ch (input offset sensing mode). Then, as shown in FIG. 5B, the switches SW1 and SW3 were opened and switch SW2 was closed to change the connection so that the capacitance Ch to which the offset voltage Vos was applied might be connected in series to the other input (inverting input) of the amplifier circuit, which canceled the input offset voltage Vos.

Figure 5A:
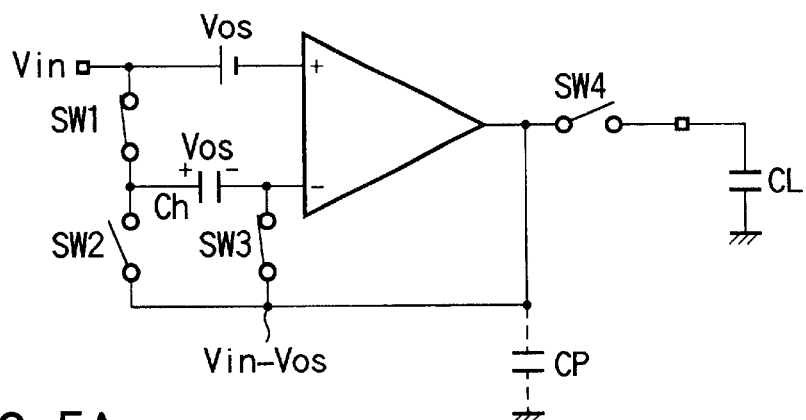
FIGS. 5A and 5B are diagrams to help explain the operation of canceling an input offset for the amplifier circuit.
Figure 5B:
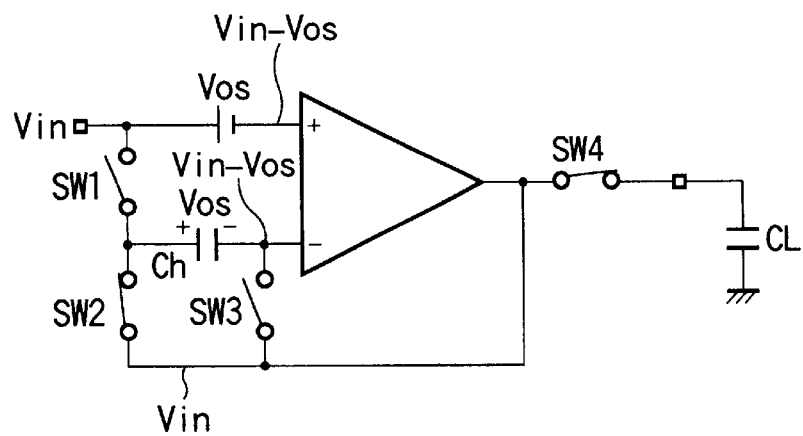

As described above, the time required to sense the offset voltage of FIG. 5A is needed to cancel the input offset voltage. To shorten the time, the signal output terminal of the amplifier circuit is normally disconnected by a switch SW4 from the load capacitor CL.

Figure 6A:
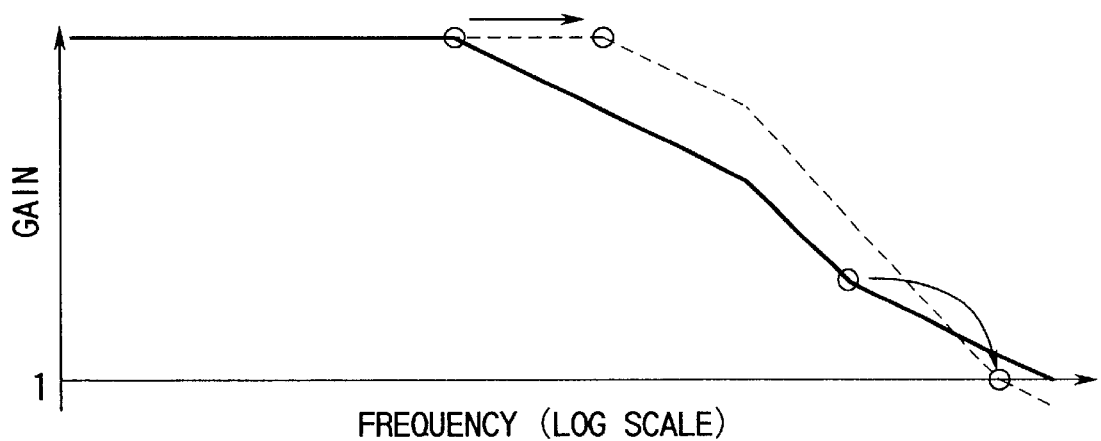
FIGS. 6A and 6B show changes in the gain-frequency characteristic and phase-frequency characteristic in the offset sensing mode when no phase compensation capacitance is used in the amplifier circuit of FIG. 1.
Figure 6B:
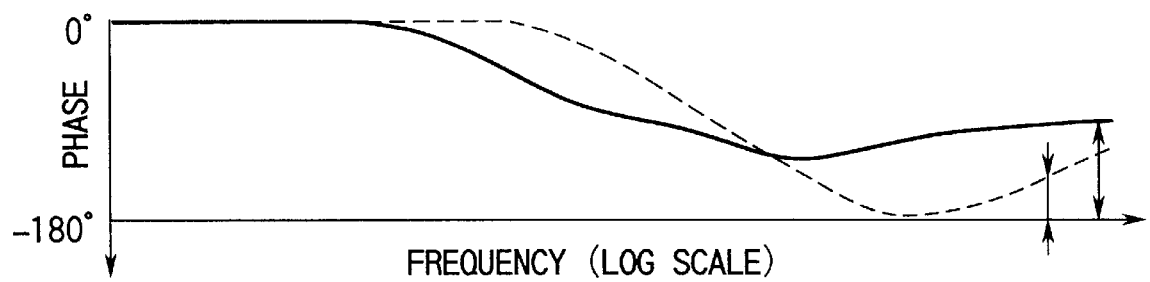

If the method of canceling the input offset voltage were applied to the amplifier circuit of the present invention, the signal output terminal OUT of the amplifier circuit of FIG. 1 would be disconnected from the load capacitor CL in the offset voltage sensing mode of FIG. 5A. This would cause the frequencies at the first pole and first zero to shift from the state indicated by the solid line toward a higher-frequency state, resulting in a decrease in the phase margin. To avoid this problem, a phase compensation capacitor Cf is also used as shown by a broken line in FIG. 6A, which secures the phase margin. In this case, the phase compensation capacitor Cf is as small as, for example, 0.5 pF, which increases the chip area slightly, having no adverse effect on the advantages of the present invention.

Next, concrete circuit configurations of the amplifier circuit 1 will be described by reference to FIGS. 7 to 22.

Figure 7:
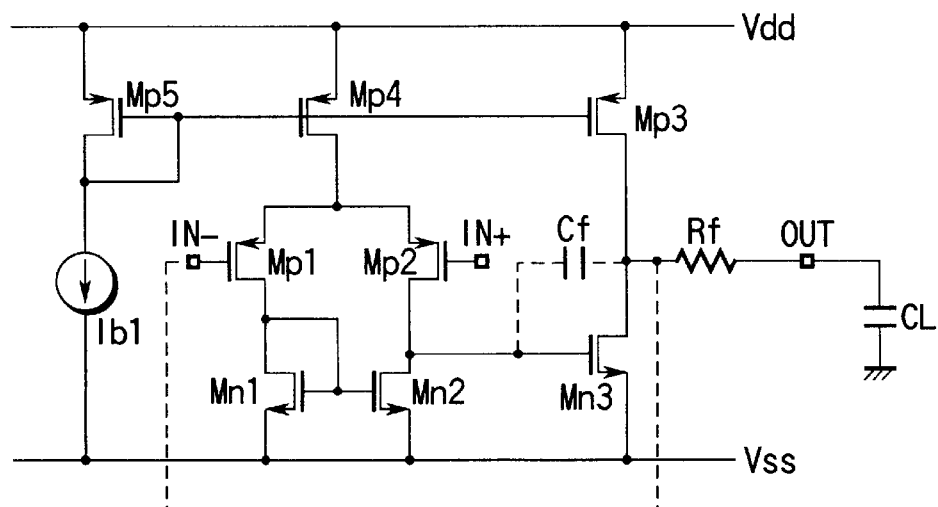
FIG. 7 is a first concrete circuit diagram of the amplifier circuit of FIG. 1.
Figure 8:
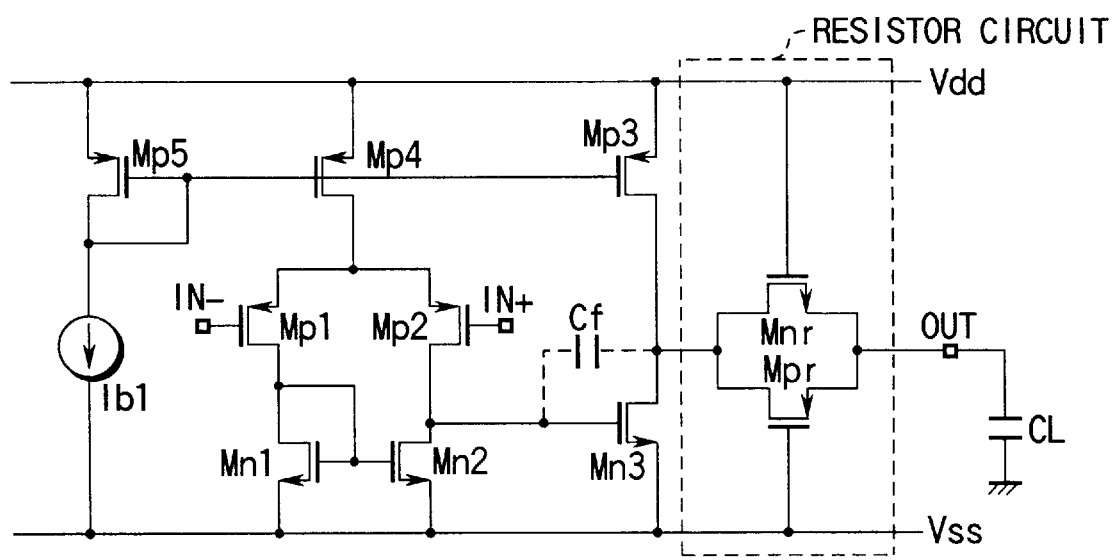
FIG. 8 is a second concrete circuit diagram of the amplifier circuit where the resistor circuit is realized using the on-resistances of field-effect transistors in FIG. 7.
Figure 9:
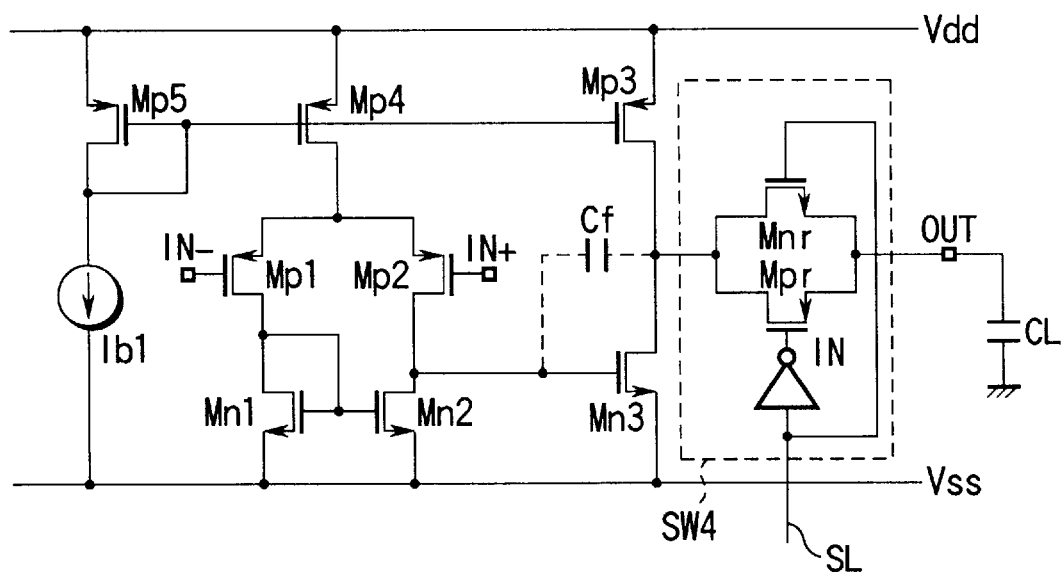
FIG. 9 is a third concrete circuit diagram of the amplifier circuit where the field-effect transistors used as the on-resistances in FIG. 8 are also used as a switch.

FIGS. 7 to 9 show a first concrete example of the amplifier circuit of FIG. 1. FIG. 7 shows a first amplifier circuit with two amplification stages. The first amplifier circuit comprises an input amplification stage, an output amplification stage fabricated by a complementary transistor pair of transistors Mp3, Mn3, and a resistor Rf constituting a resistor circuit. The input amplification stage is fabricated by transistors Mp1, Mp2 constituting a differential transistor pair, a current source fabricated by a transistor Mp4 supplying a tail current to the differential transistor pair, and a current mirror circuit fabricated by transistors Mn1, Mn2 whose current input terminal and output terminal are connected to the two output terminals or drains of the differential transistor pair. In the figure, Mpx represents a p-channel MOS transistor and Nnx indicates an n-channel MOS transistor (the same is true for the explanation below).

FIG. 8 shows a second concrete example of the amplifier circuit using the on-resistances of the transistors Mpr, Mnr instead of the resistor Rf of FIG. 7. In FIG. 8, the source and drain of a p-channel MOS transistor Mpr are connected respectively to the source and drain of an n-channel MOS transistor Mnr. The p-channel and n-channel MOS transistors constitute a resistor circuit. The common drain is connected to the node of a transistor Mp3 and a transistor Mn3 and the common source is connected to an output terminal OUT. The gate of the transistor Mpr is connected to a power supply Vss and the gate of the transistor Mnr is connected to a power supply Vdd.

FIG. 9 shows a third concrete example of the amplifier circuit where the transistors Mpr, Mnr of FIG. 8 also function as the switch SW4 needed to cancel the input offset voltage of the amplifier circuit explained in FIGS. 4A to 5B. In the amplifier circuit, the gate of the transistor Mnr is connected to the gate of the transistor Mpr via an inverter IN. With the circuit, when a switching signal is inputted to a signal line SL, both of the transistors Mpr, Mnr turn on and their on resistance functions as the resistor Rf.

Figure 10:
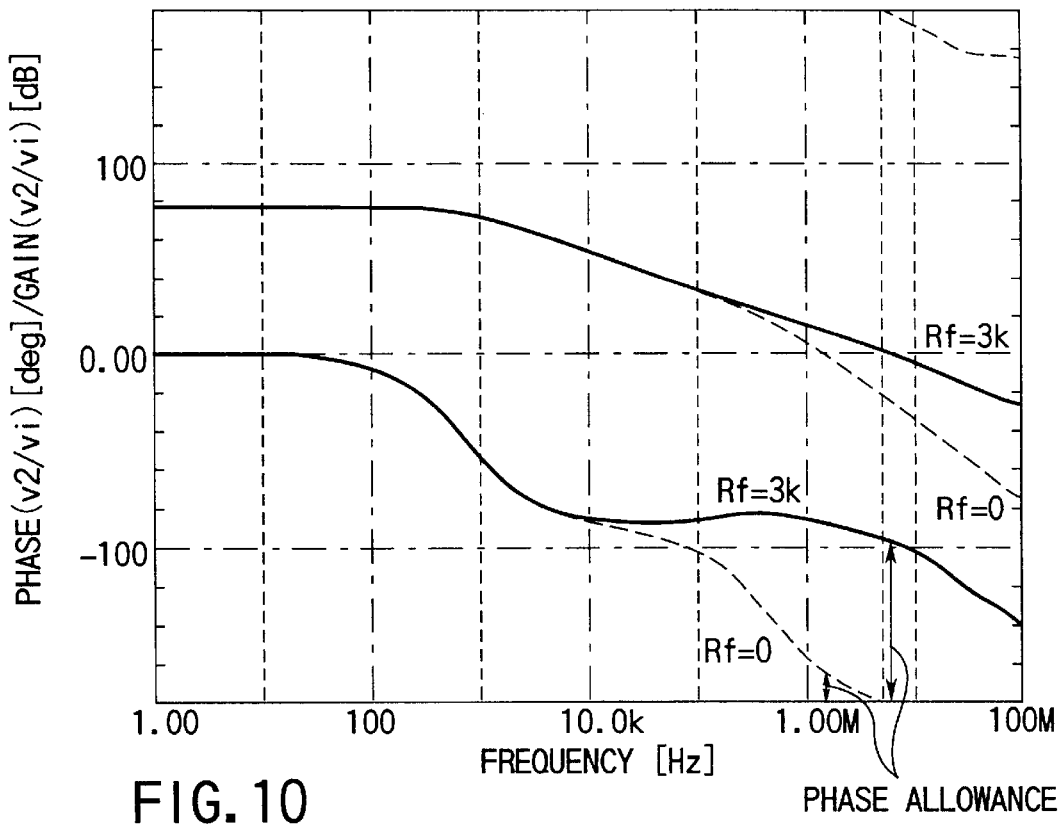
FIG. 10 is diagram to help explain the effect of improving the frequency characteristic in the present invention.

FIG. 10 shows the result of simulating the gain and phase frequency characteristics when the value of the load capacitor CL is set at 150 pF in the amplifier circuit of FIG. 7. It is clear that use of the resistor Rf has improved the phase margin remarkably, as compared with the absence of the resistor Rf.

Figure 11:
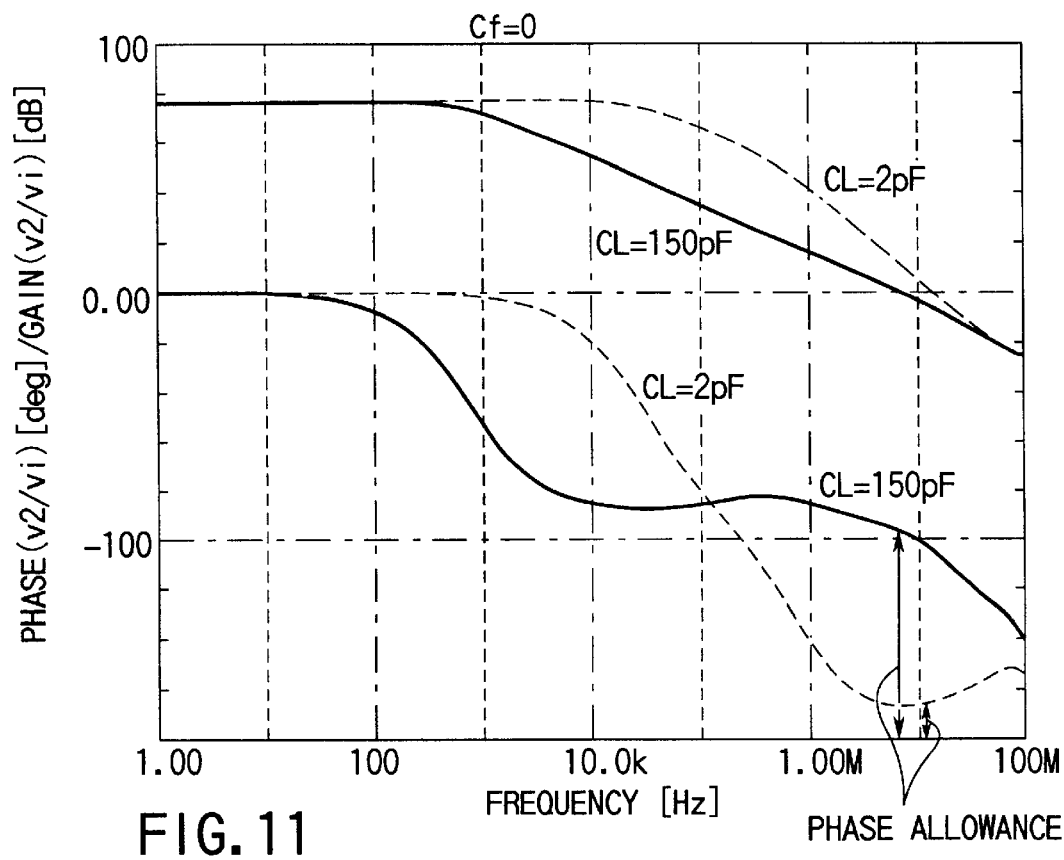
FIG. 11 shows the dependence of the frequency characteristic on a load capacitor.
Figure 12:
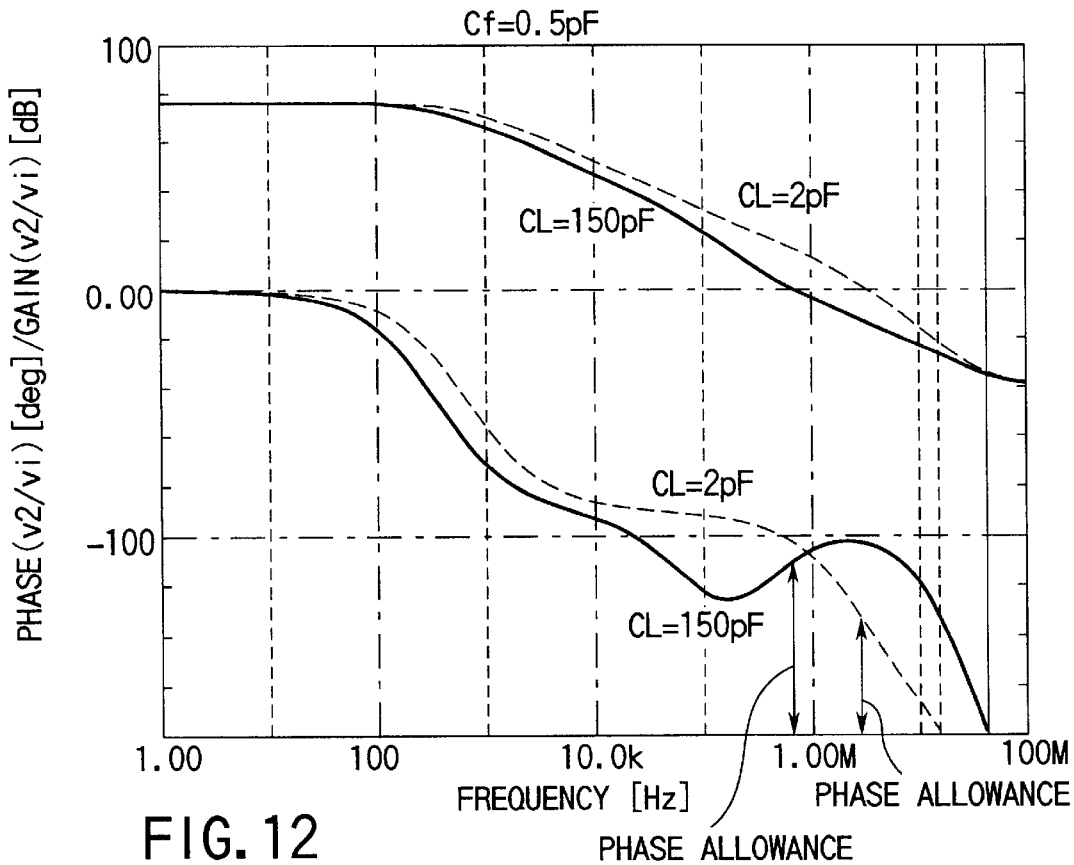
FIG. 12 shows the effect of using a phase compensation capacitance.

As described above, when the signal output terminal OUT is disconnected from the load capacitor CL in the input offset voltage sensing mode and the value of the load capacitor CL equivalently becomes as small as 2 pF, the obtained phase margin becomes small as shown in FIG. 11. To overcome this problem, use of a phase compensation capacitor Cf of as small as, for example, 0.5 pF secures a large phase margin for both large load capacitor and small load capacitor as shown in FIG. 12.

Figure 13:
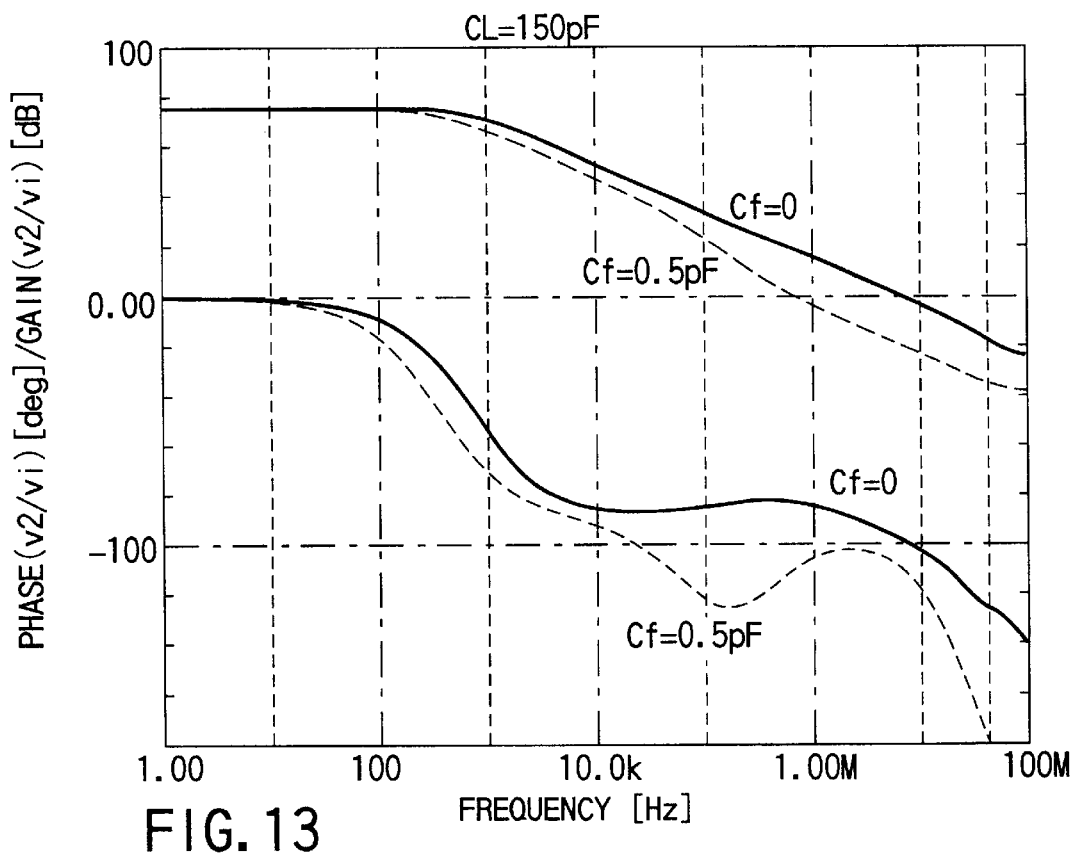
FIG. 13 shows the effect of a phase compensation capacitance on the frequency characteristic.
Figure 14:
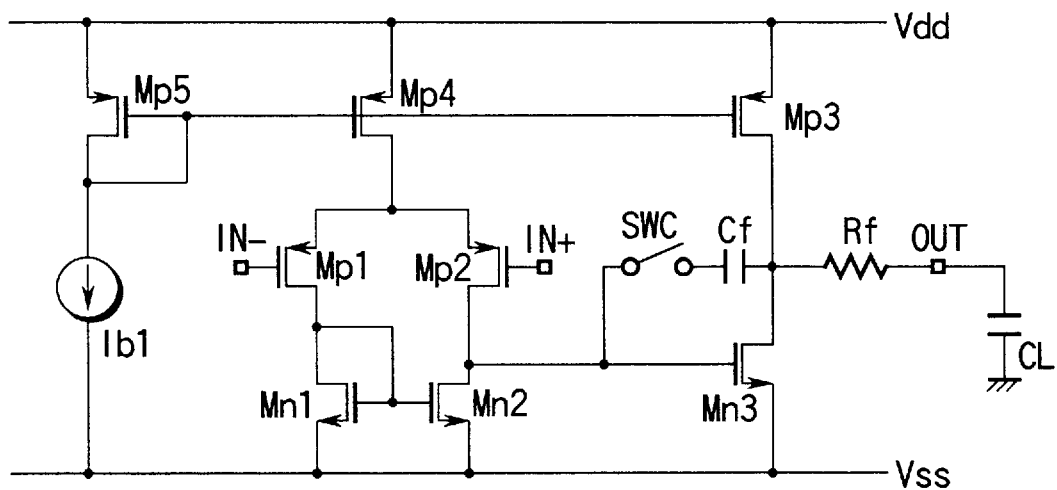
FIG. 14 is a fourth concrete circuit diagram of the amplifier circuit to which a switch for connecting or disconnecting the phase compensation capacitance.

As shown in FIG. 13, even when the capacitor is small, use of the phase compensation capacitor Cf makes the phase margin slightly smaller. To overcome this problem, a concrete example of the amplifier circuit of FIG. 14 is designed as follows. In the amplifier circuit, use of a switch SWC connected in series to the phase compensation capacitor Cf enables the signal output terminal OUT to be disconnected from the load capacitor CL in the input offset voltage sensing mode. Only when the load capacitor CL equivalently becomes as small as, for example, 2 pF, the switch SWC is closed. With the amplifier circuit, the switch SWC is connected between the node of the transistors Mn2 and Mn3 and the capacitor Cf. When the load capacitor CL becomes small, the switch SWC is closed. This secures the original phase margin of the present invention.

Figure 15:
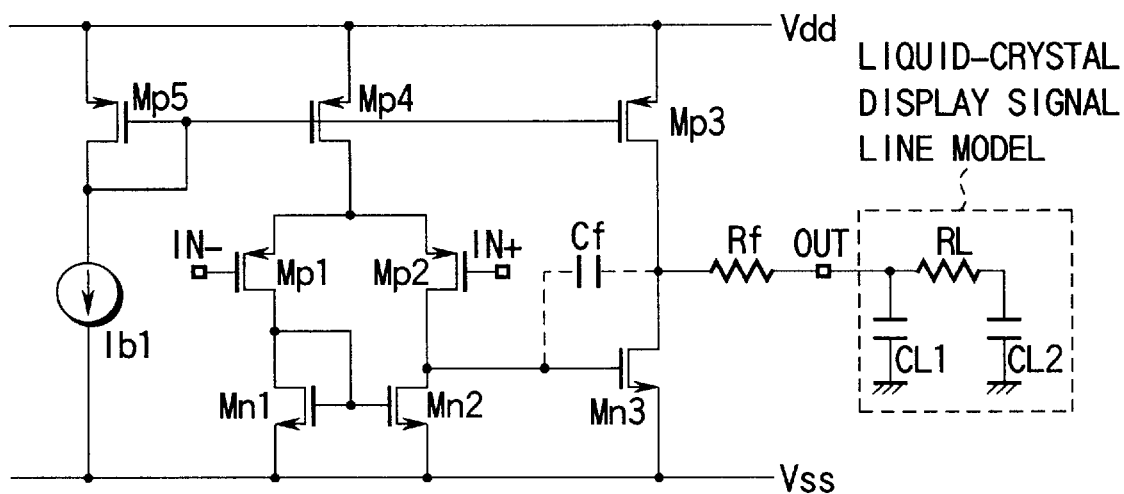
FIG. 15 is a circuit diagram of the amplifier circuit to which a load containing a resistive component is connected in FIG. 7.
Figure 16:
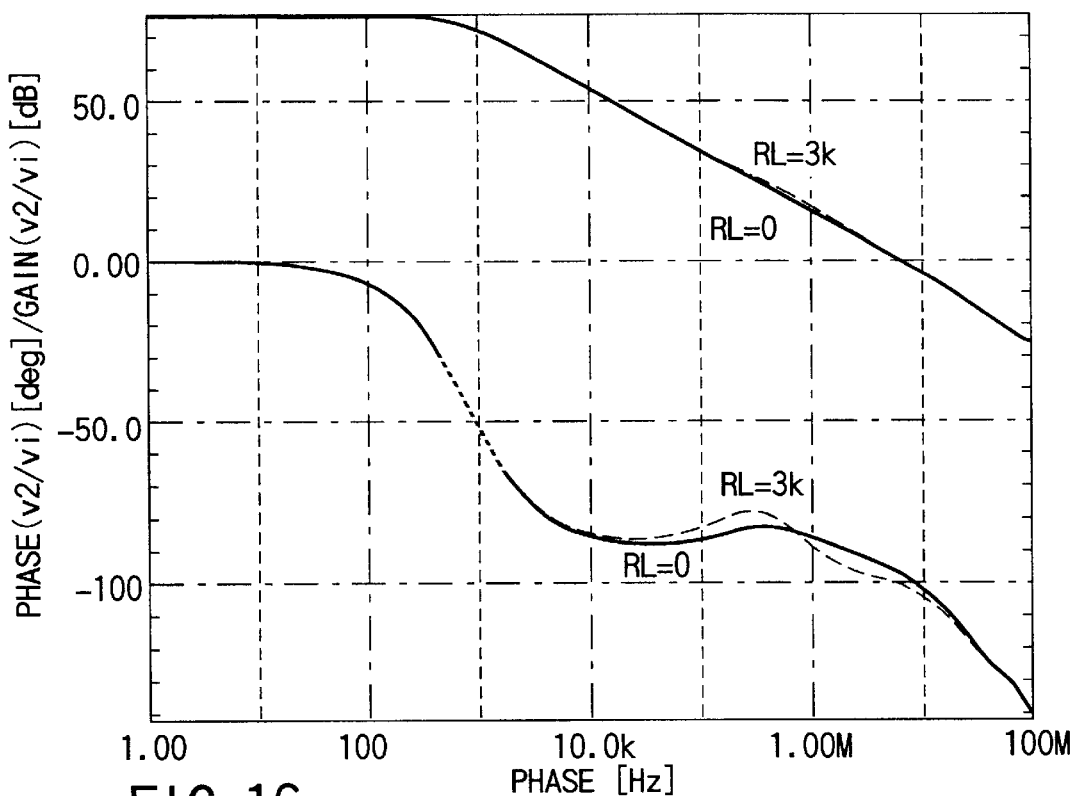
FIG. 16 shows the frequency characteristic of FIG. 15.

The signal lines of a liquid-crystal display are represented by a π-type model as shown in FIG. 15. From the result of simulation shown in FIG. 16, it is clear that the frequency characteristic hardly changes even when the load contains a resistive component RL in the π-type model.

Figure 17:
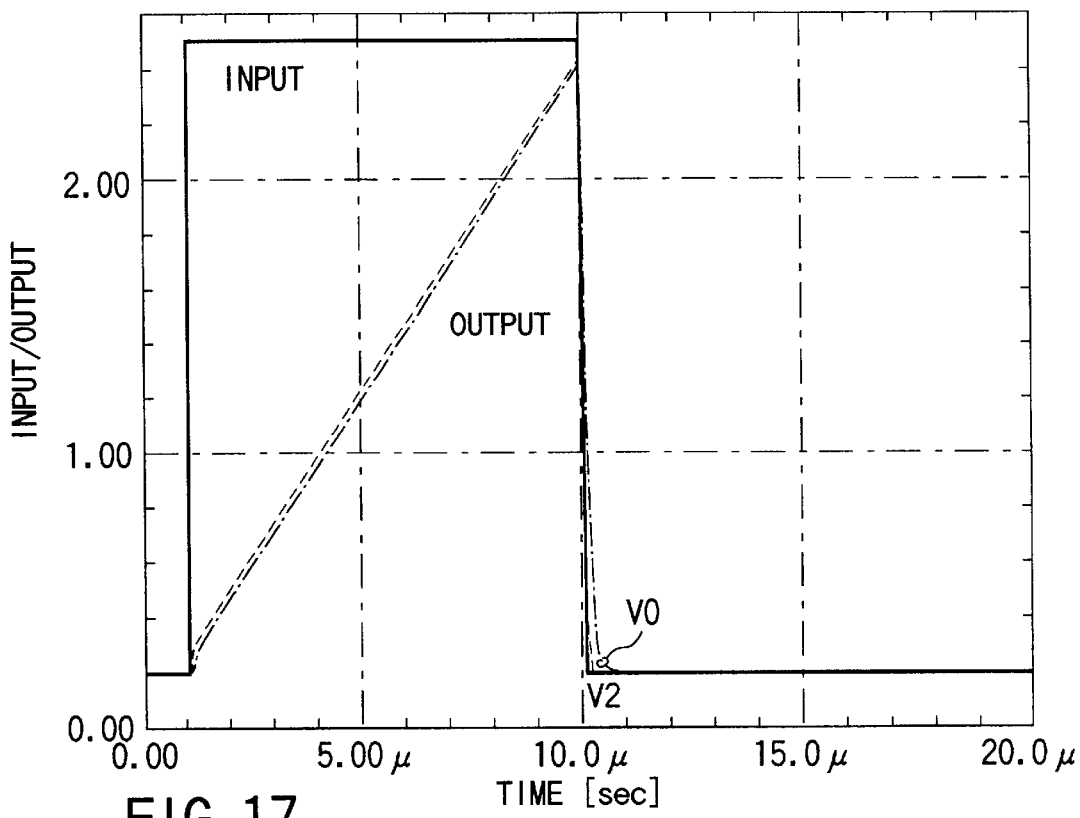
FIG. 17 shows a transitional characteristic of the amplifier circuit of FIG. 7.

FIG. 17 shows the result of simulation when a rectangular wave is inputted as an input signal voltage in a voltage follower configuration where feedback is applied from the output terminal (the drains of the transistors Mn3 and Mp3) of the output amplification stage in the amplifier circuit of FIG. 7 to the negative signal input terminal IN−. In the amplifier circuit of FIG. 7, the rise slew rate is determined by the current supplied from the transistor Mp3 and the value of the load capacitor CL. Because the current supplied from the transistor Mp3 is small, a sufficient slew rate cannot be obtained.

The rise slew rate can be improved by sensing a positive change in the input signal voltage of the amplifier circuit and increasing the output current of the transistor Mp3 supplying a bias current to the output amplification stage.

Figure 18:
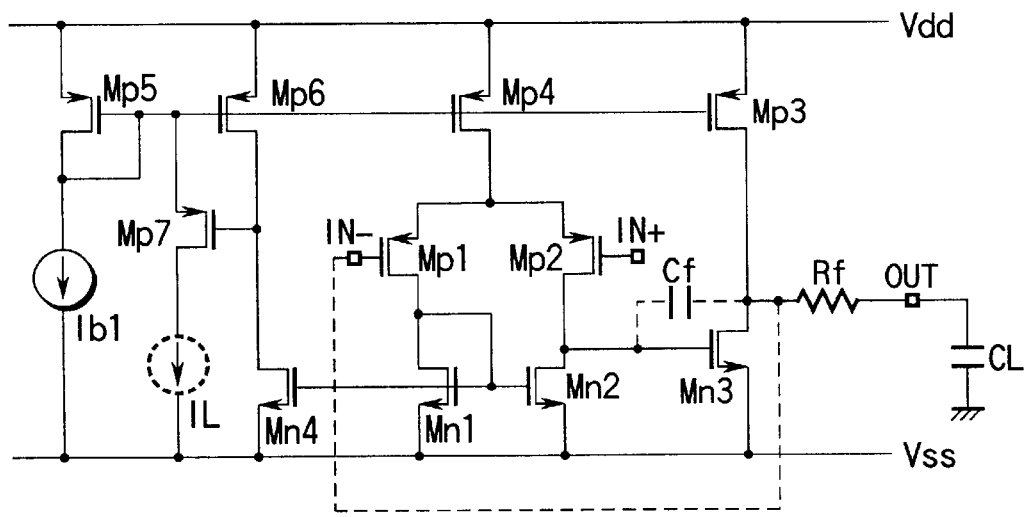
FIG. 18 is a fifth concrete circuit diagram of the amplifier circuit of FIG. 5 whose transitional characteristic has been improved.

FIG. 18 shows a fifth concrete example of the amplifier circuit whose rise slew rate is improved using the above principle. In the amplifier circuit, transistors Mn4, Mp6 sense that the input signal voltage has changed to the positive polarity. When the input signal voltage has changed to the positive polarity, a transistor Mp7 is turned on, which allows the current supplied from a current source IL to flow into a diode-connection transistor Mp5 determining the gate bias voltage of the transistor Mp3 to increase the gate bias voltage of the transistor Mp3.

The circuit of FIG. 18 will be described in further detail. The transistor Mp6 constitutes a current source. The gate of the transistor Mp6 is connected to the drain and gate of the bias-current-determining transistor Mp5. The transistor Mp 7 has its gate connected to the drains of the transistors Mn4 and Mn6, its source connected to the drain and gate of the transistor Mp5, and its drain connected to the constant current source IL.

To simplify the explanation, it is assumed that the transistor Mn4 and the transistor Mn1 in the input amplification stage 2 have the same size or the same W/L (where W is the channel width of the MOS transistor and L is the channel length of the MOS transistor). The size $(W/L)_{Mp6}$ of the transistor Mp6 is assumed to be 0.6 times the size $(W/L)_{Mp4}$ of the current source transistor Mp4 in the input amplification stage 2. When the voltage applied between the signal input terminals IN+ and IN− is zero or negative, or when the voltage at the positive-side signal input terminal IN+ is lower than the voltage at the negative-side signal input terminal IN−, a current less than the half of the current supplied from the transistor Mp4 flows through the transistor Mn1. The current in the transistor Mn1 is copied by the transistor Mn4.

The current supplied from the transistor Mp6 is 0.6 times the current supplied from the transistor Mp4 and is larger than the current flowing through the transistor Mn4. As a result, the drain voltage of the transistor Mp6 rises, turning off the transistor Mp7, which prevents the current supplied from the current source IL from being added to the transistor Mp5.

On the other hand, when the input signal voltage applied between the signal input terminals IN+ and IN− higher than a specific positive voltage, or when the voltage at the positive signal input terminal IN+ is higher than the voltage at the negative signal input terminal IN−by more than a specific value, a current larger than 0.6 times the current supplied from the transistor Mp4 flows through the transistor Mn1. The current in the transistor Mn1 is copied by the transistor Mn4.

The current supplied from the transistor Mp6 is 0.6 times the current supplied from the transistor Mp4 and is smaller than the current flowing through the transistor Mn4. As a result, the drain voltage of the transistor Mp6 drops, turning on the transistor Mp7, which allows the current supplied from the current source IL to be added to the transistor Mp5 via the transistor Mp7. This raises the gate-source voltage of the transistor Mp5, leading to an increase in the current supplied from the transistor Mp3.

As described above, because the current supplied from the transistor Mp3 in the output amplification stage 3 can be made larger when the input signal voltage changes to the positive polarity, the rise slew rate can be improved.

Figure 19:
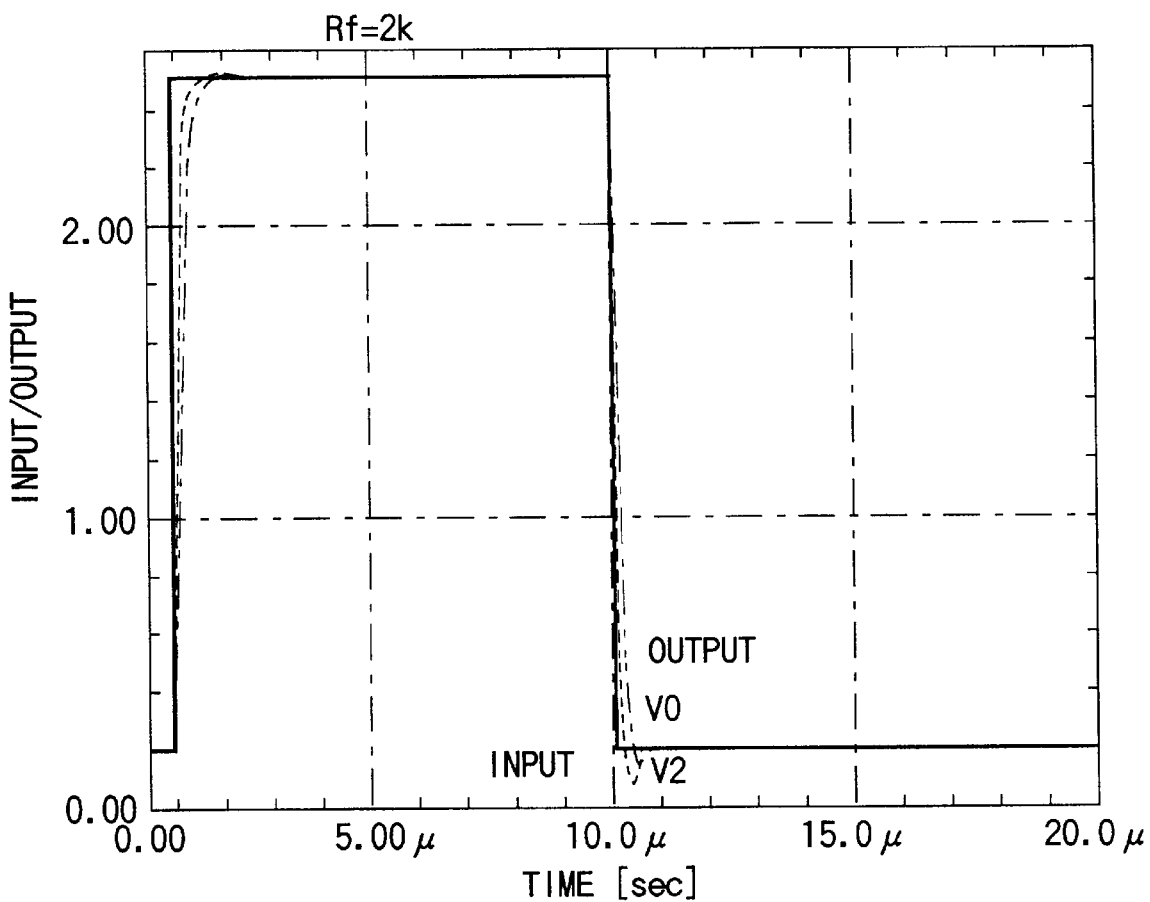
FIG. 19 shows an improved transitional characteristic of the amplifier circuit of FIG. 18.

FIG. 19 shows the result of simulation when a rectangular wave is inputted as an input signal voltage in a voltage follower configuration where feedback is applied from the output (the drains of the transistors Mn3 and Mp3) of the output amplification stage to the negative-side signal input terminal IN− in the amplifier circuit with the improved rise slew rate shown in FIG. 18. In the figure, v2 is the output voltage (the drain voltage of the transistors Mp3 and Mn3) of the output amplification stage 2 and vo is the voltage at the signal output terminal OUT. It is seen that the rising characteristic has been improved as much as the falling characteristic has.

Since the resistor circuit Rf and the load capacitor CL constitute a low-pass filter (hereinafter, referred to as an LPF), the time constant τ (=Rf·CL) causes vo to lag v2. Generally, in an LPF fabricated by resistor and capacitor, the time about five times the time constant is required for settling. When the amplifier circuit of the present invention is applied to a liquid-crystal display driving circuit where the signal voltage changes at specific intervals of time, the time constant τ is set at more than zero and not more than ⅕ of the specific interval.

This shortens the delay time in the voltage vo at the signal output terminal OUT with respect to the output voltage v2 at the input amplification stage 2 as shown in FIG. 19, which fulfills the specific settling characteristic. Specifically, for example, because the driving period of the signal voltage in the liquid-crystal display driving circuit is about 20 μsec, the value of the resistor circuit Rf is set at 50 kΩ or less, provided that the load capacitor CL is about 50 pF to 100 pF.

Figure 20:
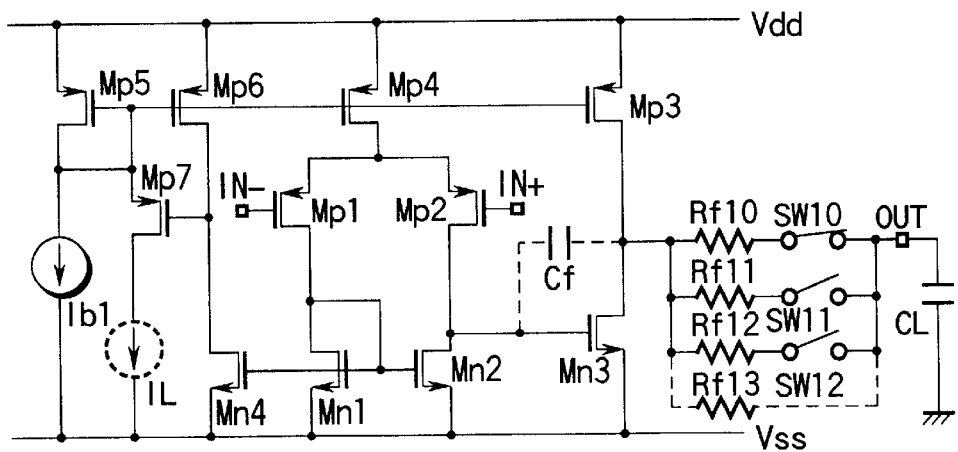
FIG. 20 is a sixth concrete circuit diagram of a modification of the amplifier circuit of FIG. 18.
Figure 21:
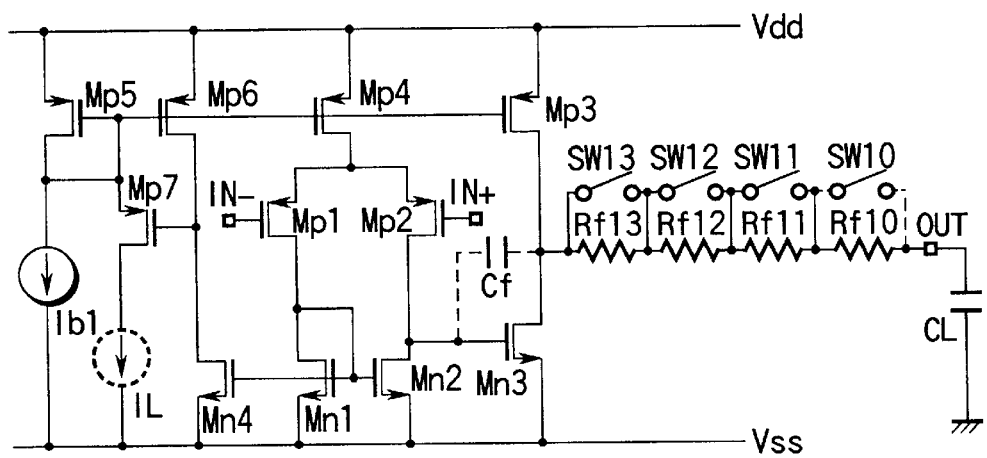
FIG. 21 is a seventh concrete circuit diagram of a modification of the amplifier circuit of FIG. 18.
Figure 22:
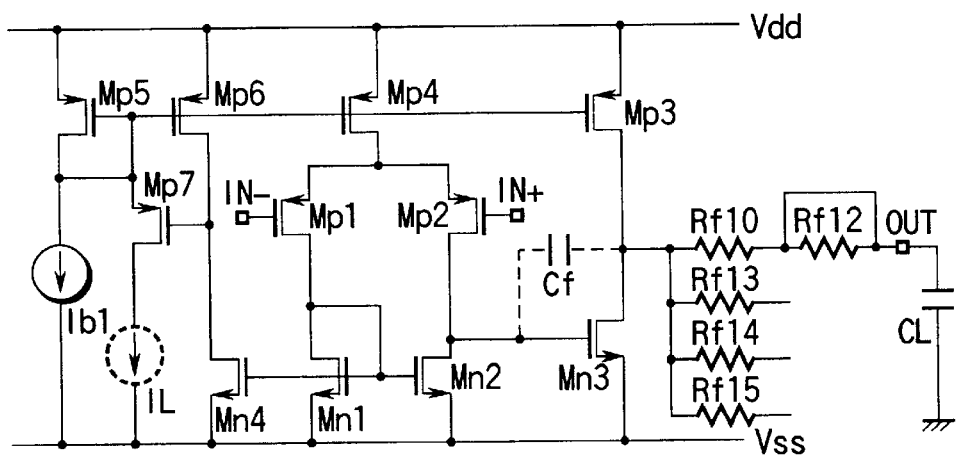
FIG. 22 is an eighth concrete circuit diagram of a modification of the amplifier circuit of FIG. 18.

Since the signal lines for the liquid-crystal display change according to the size of the display or the material for the signal lines, it is desirable that the resistor Rf should be set at the optimum value according to those factors. FIGS. 20 to 22 show concrete examples for setting the resistor Rf at the optimum value.

FIG. 20 shows a concrete example of an amplifier circuit where resistors Rf10, Rf11, Rf12, . . . differing in value are provided in parallel via switches SW10, SW11, SW12, . . . between the output terminal (the drains of the transistors Mn3, Mp3) of the output amplification stage and the signal output terminal OUT. Opening and closing the switches SW10, SW11, SW12, . . . enables the value of the resistor Rf to be selected.

In FIG. 20, the values of the resistors Rf10, Rf11, Rf12, . . . may be made equal and the value of the resistor Rf be selected by changing the number of parallel-connected resistors by the opening and closing of the switches SW10, SW11, SW12, . . .

FIG. 21 shows a seventh concrete example of an amplifier circuit where resistors Rf10, Rf11, Rf12, . . . differing in value are provided in series between the output terminal (the drains of the transistors Mn3, Mp3) of the output amplification stage and the signal output terminal OUT and switches SW10, SW11, SW12, . . . are provided respectively in parallel with the resistors Rf10, Rf11, Rf12, . . . Opening and closing the switches SW10, SW11, SW12, . . . enables the value of the resistor Rf to be determined.

In FIG. 21, the values of the resistors Rf10, Rf11, Rf12, . . . may be made equal and the value of the resistor Rf be selected by changing the number of series-connected resistors by the opening and closing of the switches SW10, SW11, SW12, . . .

FIG. 22 shows an eighth concrete example of an amplifier circuit which is realized as follows. In integrating an amplifier circuit, resistors Rf10, Rf11, Rf12, . . . have been formed beforehand on a chip. One or more of the resistors Rf10, Rf11, Rf12, . . . are produced by changing only the metal wire layers in such a manner that the value of the resistor Rf becomes optimum according to the liquid-crystal display panel.

Figure 23:
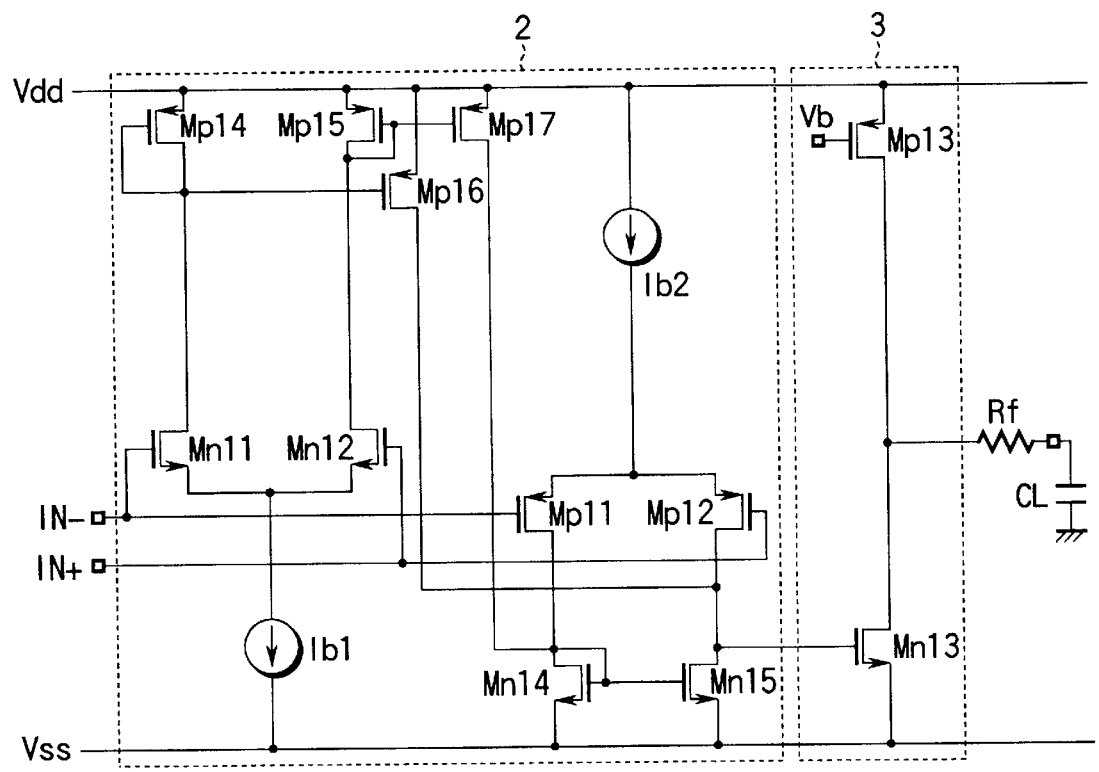
FIG. 23 is a ninth concrete circuit diagram of an amplifier circuit where the present invention has been applied to an amplifier circuit with the large common-mode input voltage range.

FIG. 23 shows a ninth concrete example of a rail-to-rail-type amplifier circuit where the present invention has been applied to an amplifier circuit with a wide large common-mode input voltage range. In the amplifier circuit, the input amplification stage 2 comprises a first differential amplifier circuit, a second differential amplifier circuit, and a current mirror circuit made up of transistors Mp14 to Mp17. The first differential amplifier circuit is comprised of a differential pair of transistors Mp11, MP12 and a bias current source Ib2 and has the large common-mode input voltage range on the Vss side. The second differential amplifier circuit is comprised of a differential pair of transistors Mn11, Mn12 and a bias current source Ib1 and has the large common-mode input voltage range on the Vdd side. With this configuration, the output current of the first differential amplifier circuit and that of the second differential amplifier circuit are returned at the current mirror circuit and added together. The transistors Mn14, Mn15 function as active loads.

With such a configuration, even when the input voltage is on either the Vdd side or the Vss side, either the first or second differential amplifier circuit operates, which realizes the input amplification stage 2 with a wider input large common-mode voltage range. In the configuration, the signal path when the input voltage is on the Vdd side is longer than the signal path when the input voltage is on the Vss side, which causes a delay time difference. With the operating speed of an amplifier circuit for an ordinary a-Si TFT (amorphous silicon thin film transistor) liquid-crystal display driving circuit, the delay time difference is so small that the effect of the present invention remains unchanged.

Figure 24:
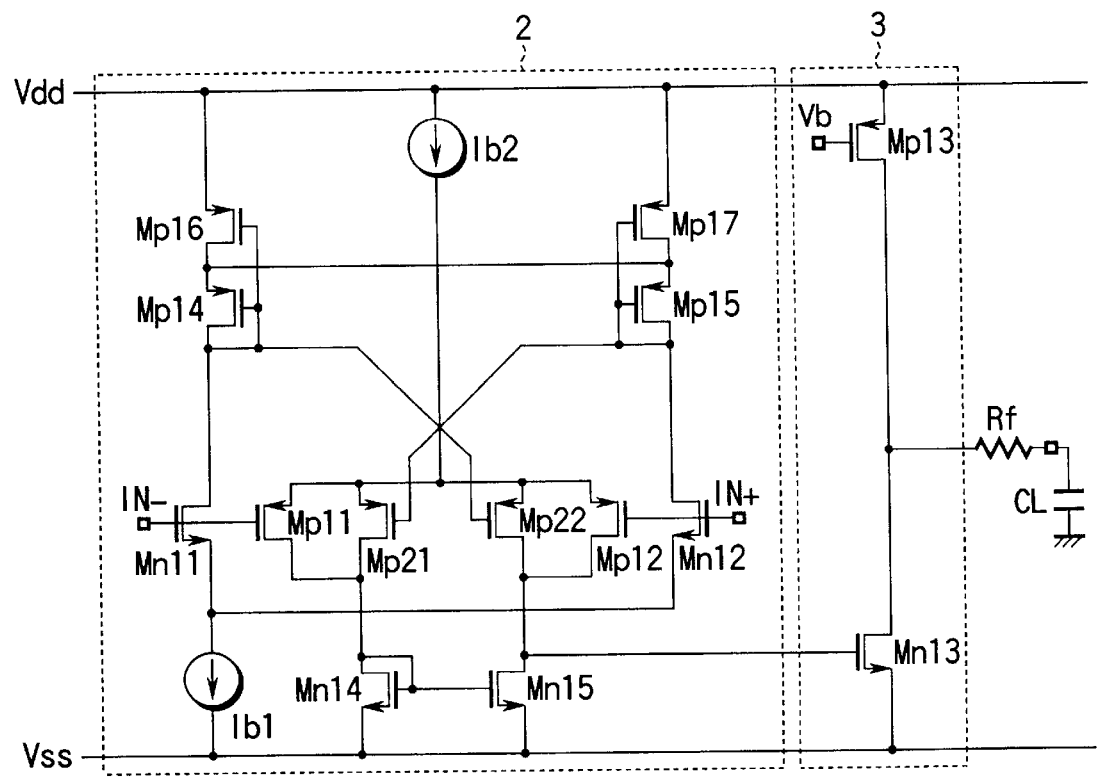
FIG. 24 is a tenth concrete circuit diagram of an amplifier circuit where the present invention has been applied to an amplifier circuit with the large common-mode input voltage range.

FIG. 24 shows a tenth concrete example of a rail-to-rail-type amplifier circuit where the present invention has been applied to an amplifier circuit with a wide large common-mode input voltage range. In the input amplification stage 2, a differential pair of an transistors Mp11, Mp12 has their sources connected to the sources of transistors Mp11, Mp12 forming a differential pair. An input signal is applied to the gates of the transistors Mp11, Mp12. The gates of the transistors Mp13, Mp14 are connected to the output of a differential amplifier circuit fabricated by transistors Mn11, Mn12. The operating point of the output of the differential amplifier circuit comprised of the differential pair of the transistors Mn11, Mn12 is set at the voltage on which the transistors Mp11, Mp12 operate.

With this configuration, even when the input voltage approaches the Vdd side and the transistors Mp11, Mp12 turn off, the transistors Mp21, Mp22 operate via the differential amplifier circuit comprised of the differential pair of the transistors Mn11, Mn12. This realizes the input amplification stage 2 with a wider large common-mode voltage range. In the configuration, when the input voltage is on the Vdd side, the signal passes through the differential amplifier circuit comprised of the differential pair of the transistor Mn22, Mn22. Accordingly, the operation delays by the delay time of the differential amplifier circuit as compared with the operation when the input voltage is closer to the Vss side. With the operating speed of an amplifier circuit for an ordinary a-Si TFT liquid-crystal display driving circuit, the delay time difference is so small that the effect of the present invention remains unchanged.

Figure 25:
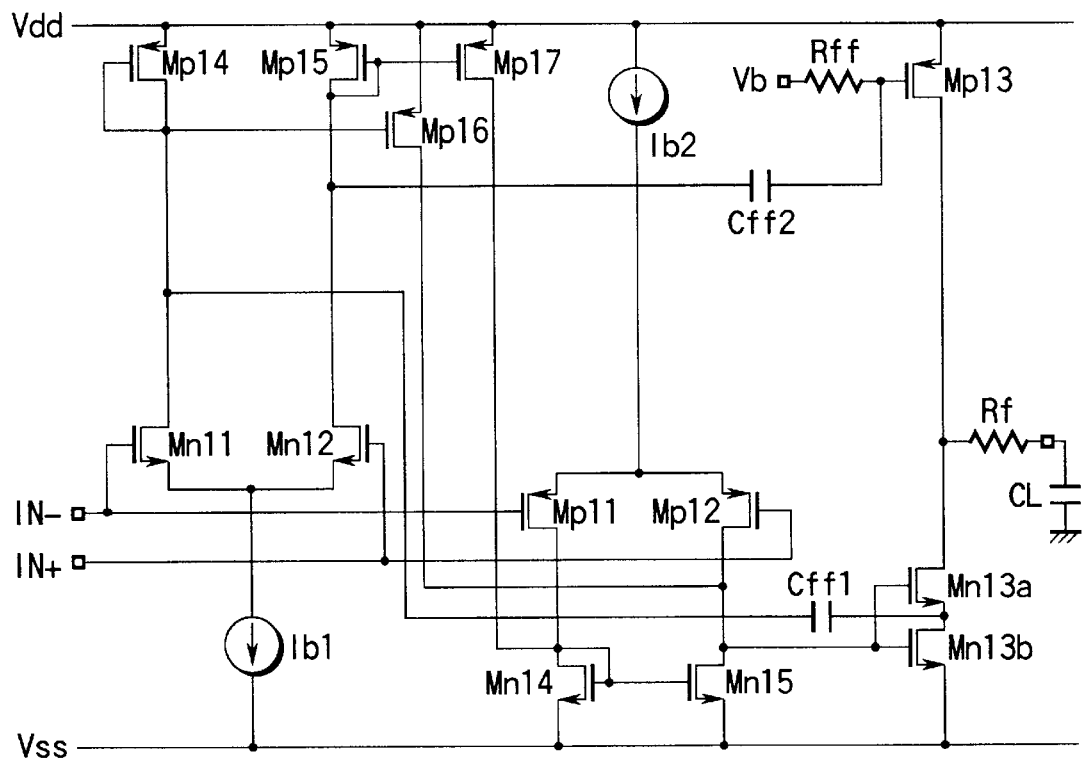
FIG. 25 is an eleventh concrete circuit diagram of an amplifier circuit where the amplifier circuit of FIG. 23 has been improved to operate faster.
Figure 26:
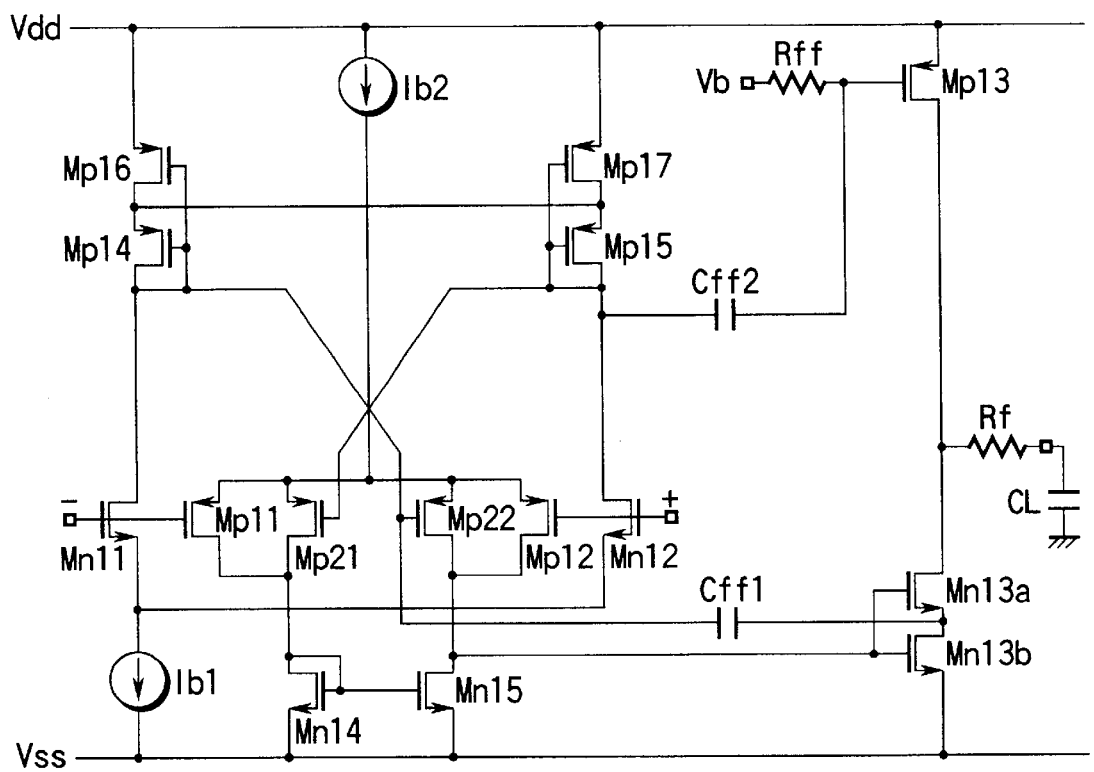
FIG. 26 is a twelfth concrete circuit diagram of an amplifier circuit where the amplifier circuit of FIG. 24 has been improved to operate faster.

In the examples of FIGS. 23 and 24, an amplifier circuit for an a-Si TFT liquid-crystal display driving circuit has been used. In the case of an amplifier circuit for a Poly-SiTFT liquid-crystal display driving circuit, since signal lines in the panel are driven by a single amplifier circuit in a time division manner, the amplifier circuit is required to operate more than ten times faster than the amplifier circuit for an a-Si TFT liquid-crystal display driving circuit. Therefore, the delay time difference in the input voltage caused at the input amplification stage with the wider large common-mode input range cannot be ignored differently from the amplifier circuit for an a-Si TFT liquid-crystal display driving circuit. As a result, the phase margin decreases. To alleviate the delay time difference, a feedforward means including a capacitive element is added from the output of the differential amplifier circuit comprised of the differential pair of the transistors Mn11, Mn12 which is additionally provided in order to wide the range of the large common-mode input voltage as shown in FIGS. 25 and 26. As a result, the operation time can be shorted by the time at which the high frequency component passes through the transistors Mp16, Mp17 in FIG. 25 or the transistors Mp21, Mp22 in FIG. 26.

Specifically, in FIGS. 25 and 26, a bias voltage Vb is applied via resistor Rff to the gate of the transistor Mp13 constituting a bias current source for the output amplification stage. A feedforward means of capacitor Cff2 is added from the gate of the transistor Mp15 to the gate of the transistor Mp13. The amplification transistor Mn13 at the output amplification stage is replaced with cascade-connected transistors Mn13a, Mn13b whose gates are connected to each other. A feedforward means of capacitor Cff1 is added between the connection point of the source of the transistor Mn13a and the drain of the transistor Mn13b and the gate of the transistor Mp14. With this configuration, even when the input voltage changes at high speed, the delay time difference in the input voltage caused at the input amplification stage with the wider large common-mode input voltage range can be alleviated because the high-frequency components at the changing point are fed forward to the output amplification stage via the capacitive feedforward meanss.

Figure 27:
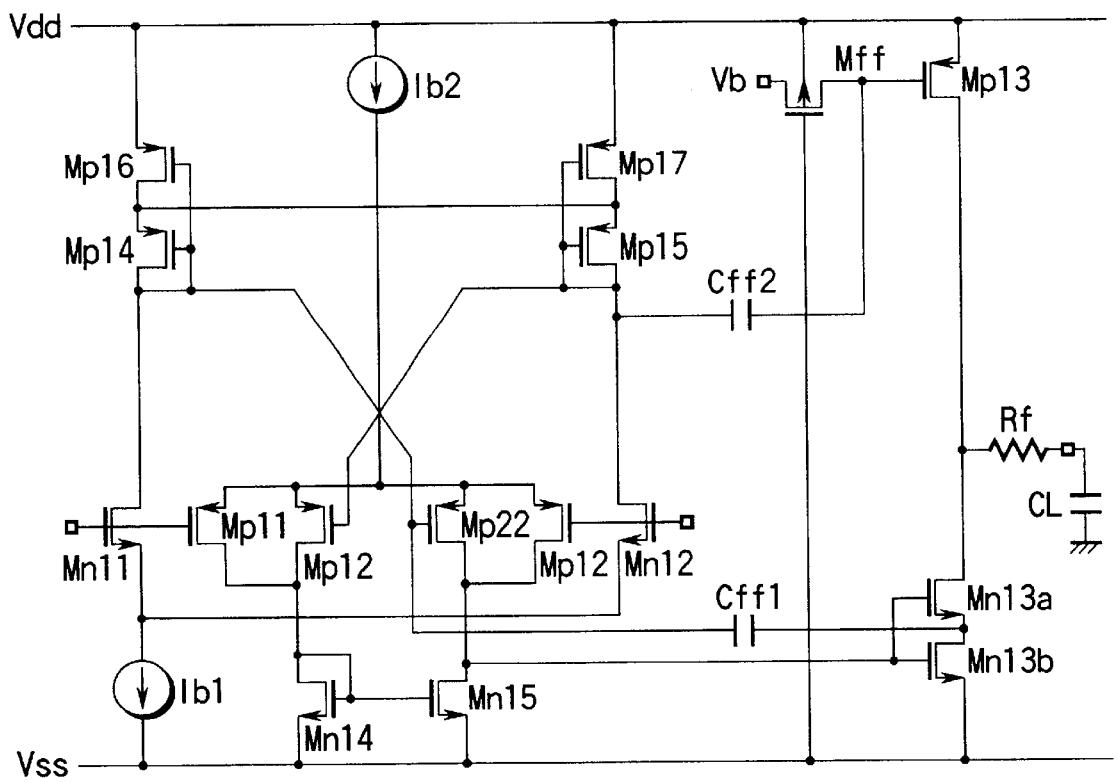
FIG. 27 is a thirteenth concrete example of an amplifier circuit using the field-effect transistors used as the on-resistances in FIG. 26.

While in FIGS. 25 and 26, the resistor Rff is used to form a feedforward means to the gate of the transistor Mp13, the on resistance of a field-effect transistor Mff may be used as shown in FIG. 27.

Figure 28:
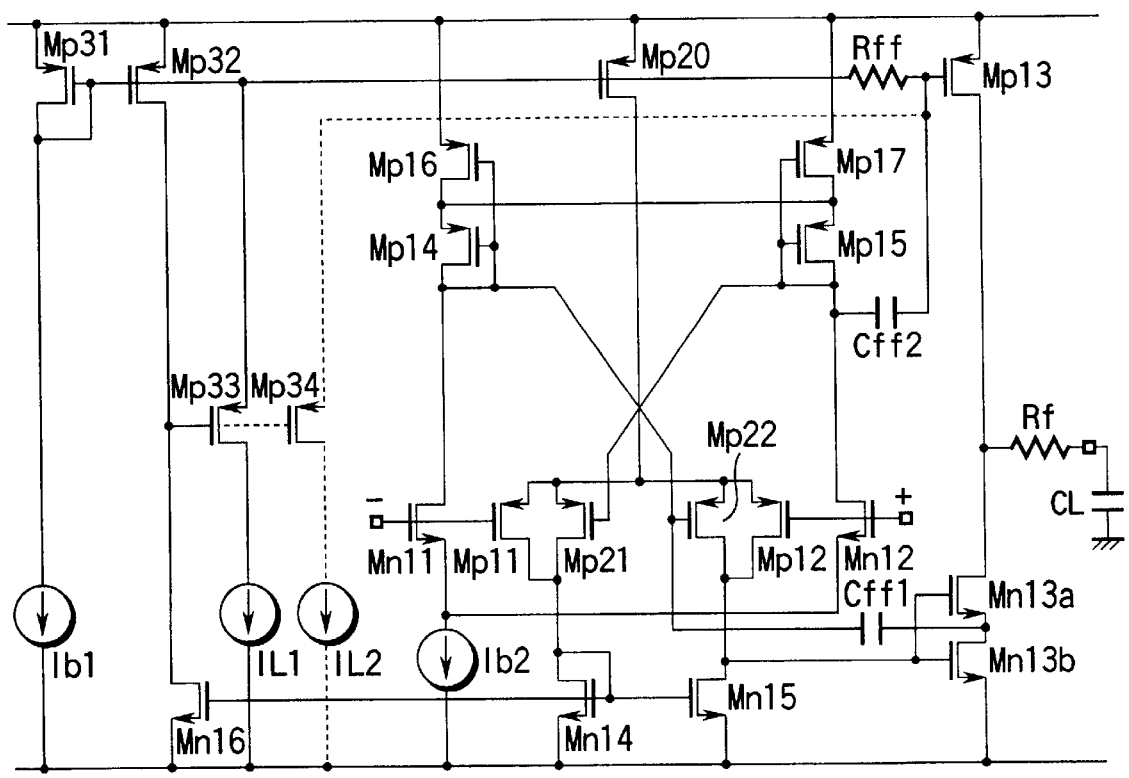
FIG. 28 is a fourteenth concrete example of a modification of the amplifier circuit of FIG. 26 whose transitional characteristic has been improved.
Figure 29:
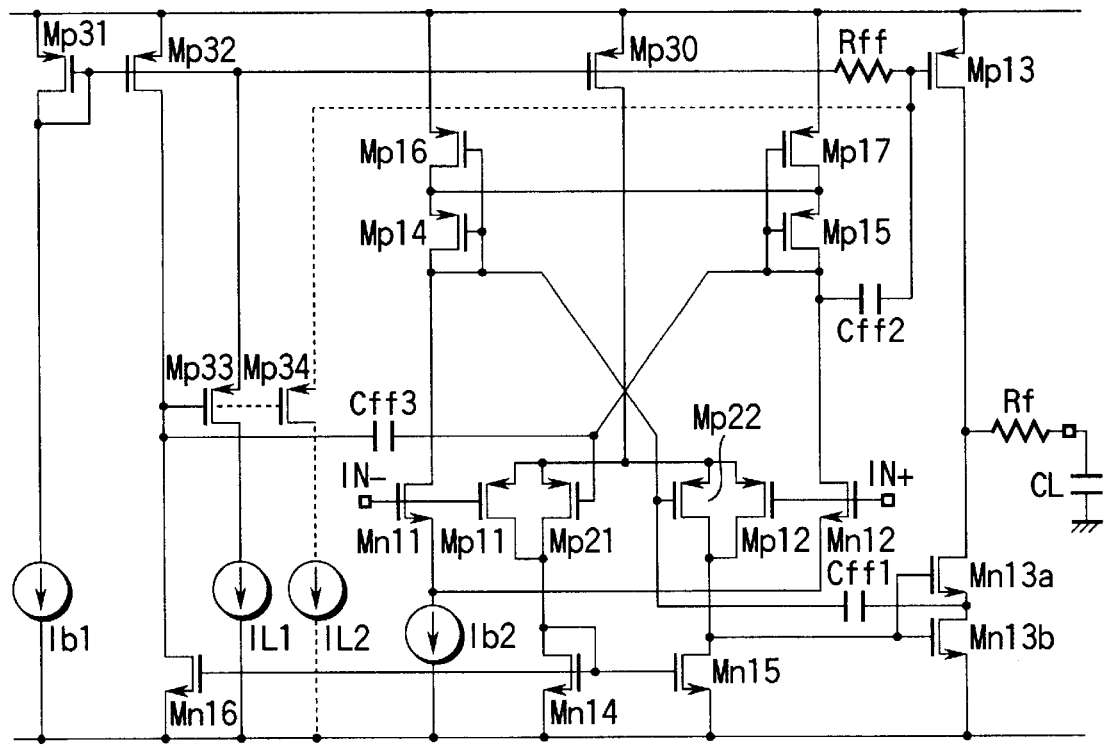
FIG. 29 is a fifteenth concrete example of another modification of the amplifier circuit of FIG. 26 whose transitional characteristic has been improved.

Furthermore, as shown in FIG. 28, a bias voltage (Vb) control circuit may be inserted. The bias voltage control circuit senses that the input signal voltage has changed toward the positive side and increases the output current of the transistor Mp13 supplying the bias voltage (Vb) to the output amplification stage 3. In this case, instead of directly adding the bias current IL2 to the bias current Ib1 of the amplifier circuit when the input signal voltage has changed toward the positive side, adding the bias current IL2 via the resistor Rff forming a feedforward means causes a voltage of IL2×Rff to be applied across the resistor Rff as shown by a broken line in FIG. 28. This enables a small bias current IL to raise the gate-source voltage of the transistor Mp13. Namely, when the input signal voltage has changed toward the positive side, a small bias current IL causes the transistor Mp13 to supply a large output current.

In the amplifier circuit of FIG. 28, when the input voltage has changed from a low voltage to a high voltage significantly, a bias voltage (Vb) control circuit fabricated by transistors Mn16, Mp32, Mp33, Mp34, and current sources IL1, I12 senses the change and increases the output current of the transistor Mp13 supplying a bias current to the output amplification stage 3. The control circuit is connected to a differential pair of transistors Mp11, Mp12 via a differential pair of transistors Mn11, Mn12 provided to widen the large common-mode input voltage range and an amplifier circuit comprised of active loads of transistors Mp14 to Mp17. The output of the differential pair is applied to the gate of a transistor Mn16, the input to the control circuit. As a result, when the input voltage has changed, there is a delay from when the control circuit begins to operate until it increases the output current. The delay can be alleviated because a change in the input voltage is fed forward to the input voltage change sensing section output via a capacitor Cff3 by providing the capacitor Cff3 between the output of a transistor Mn12 and the output of a transistor Mn16, the input voltage change sensing section output. The output of the transistor Mn12 is the output of an amplifier circuit comprised of a differential pair of transistors Mn11, Mn12 provided to widen the large common-mode input voltage range and an active load of transistors Mp14, Mp17.

Figure 30:
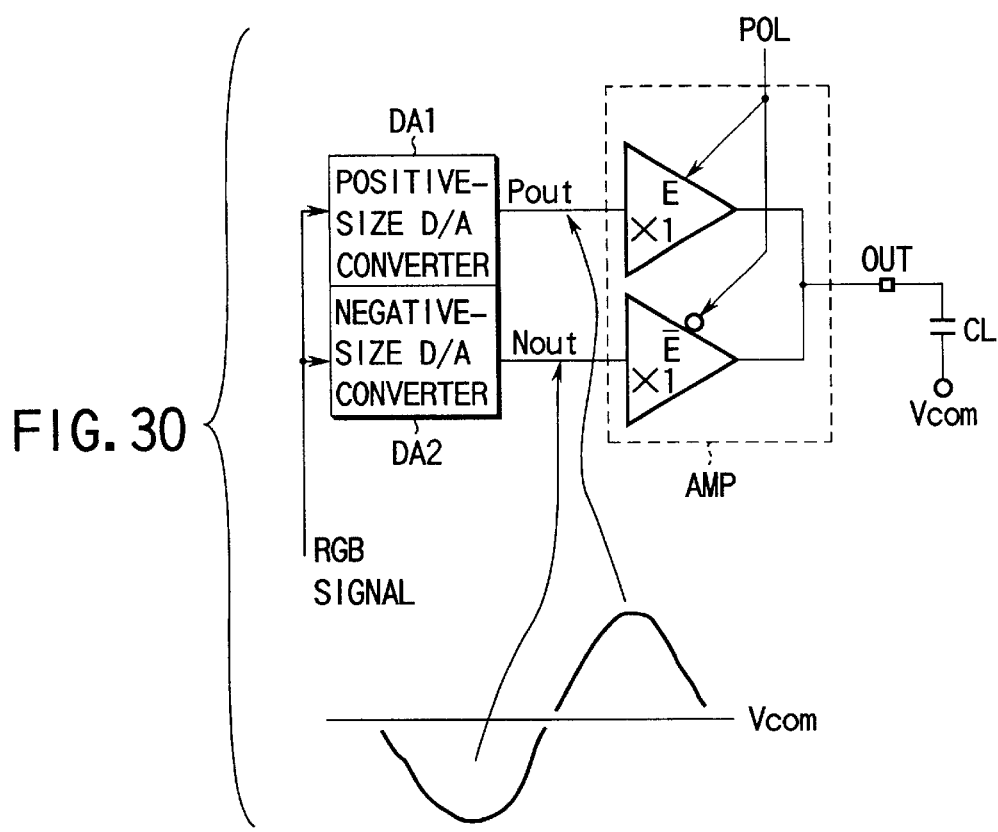
FIG. 30 is a circuit diagram to help explain the function necessary for the amplifier circuit in a liquid-crystal display driving circuit when a common electrode voltage Vcom is kept constant.

FIG. 30 shows the function of an amplifier circuit for a liquid-crystal display driving circuit. When a common voltage Vcom applied to the common electrode side of the liquid-crystal cells is kept constant as shown in FIG. 30 and a signal voltage VRGB is inverted periodically using the voltage Vcom as a reference, the liquid-crystal display driving circuit requires a positive-side D/A converter DA1 for digital-analog converting the VRGB signal inputted as shown in FIG. 30 into a positive voltage with respect to Vcom, a negative-side D/A converter DA2 for digital-analog converting the $V_{RGB}$ signal into a negative voltage with respect to Vcom, and a two-input amplifier circuit AMP with different input voltage change ranges for amplifying the outputs of the positive- and negative-side D/A converters. In the two-input amplifier circuit AMP, when one amplifier to which the output of one D/A converter is inputted is on, the other amplifier circuit to which the output of the other D/A converter is inputted has to be off.

Figure 31:
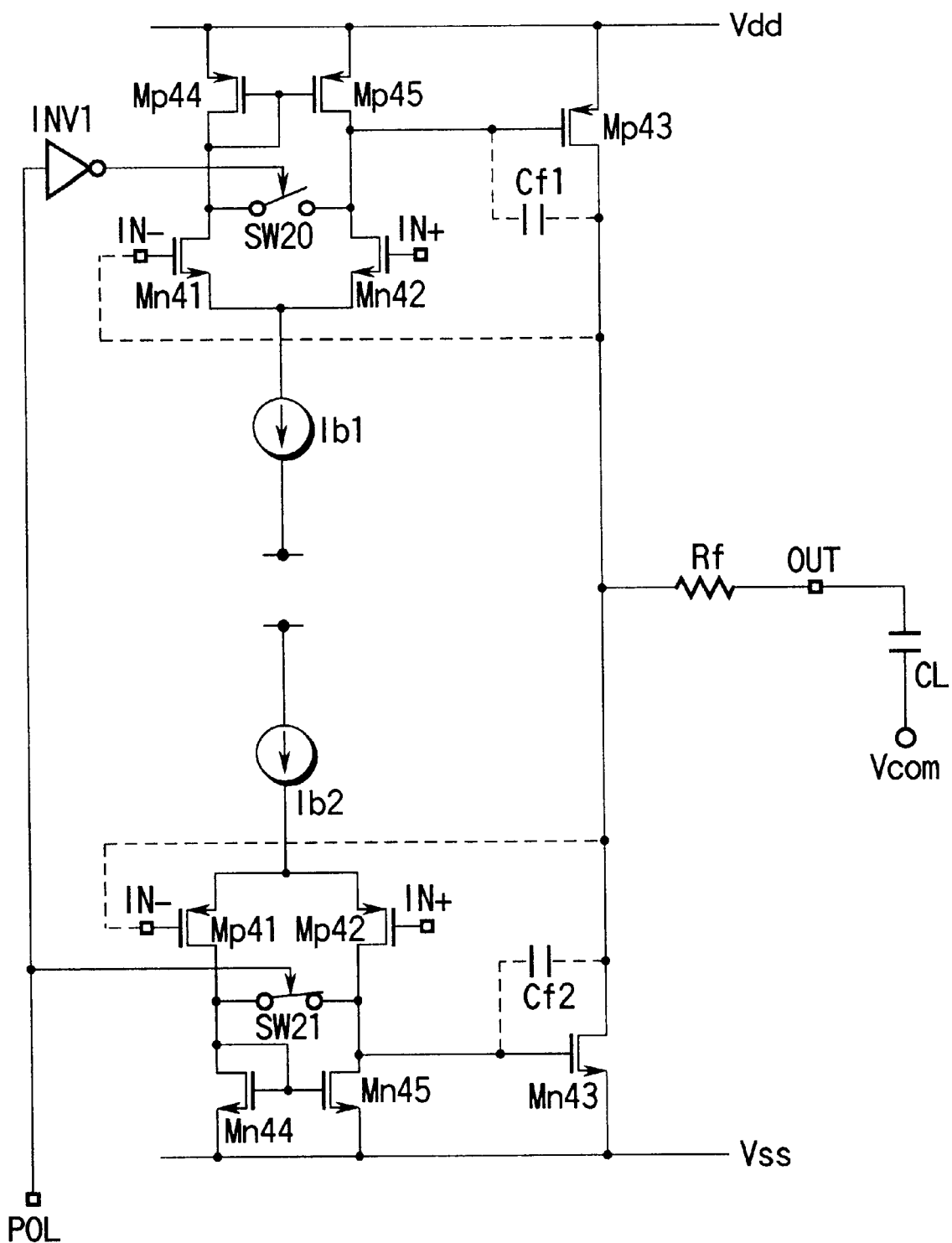
FIG. 31 is a sixteenth concrete circuit diagram of a two-input amplifier circuit with different input signal voltage ranges according to the present invention.
Figure 32:
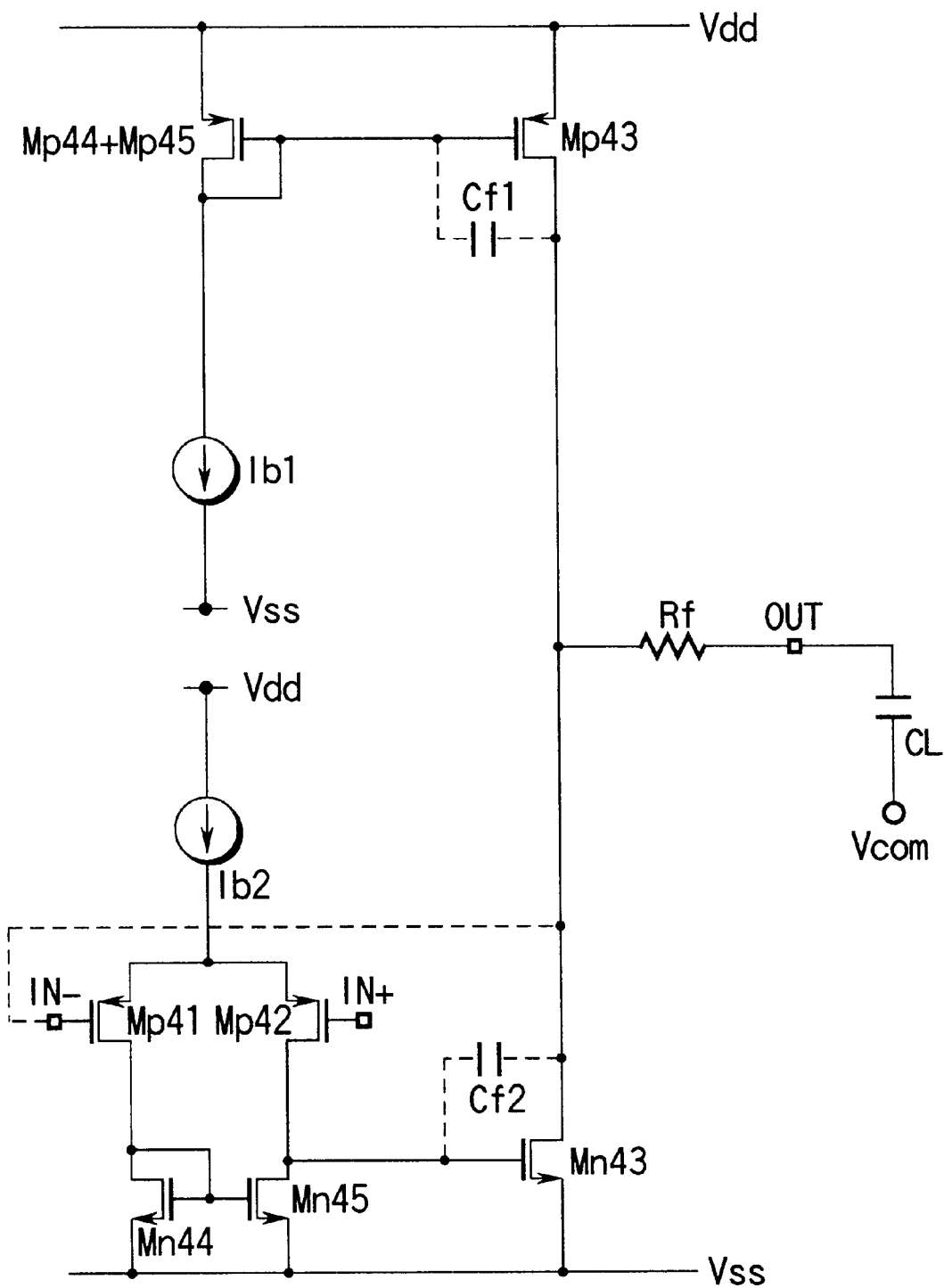
FIG. 32 is a circuit diagram to help explain the operation of the amplifier circuit of FIG. 31.

FIG. 31 shows a fifteenth concrete example of the two-input amplifier circuit with different input signal voltage ranges to which the present invention has been applied. The two-input amplifier circuit has two amplification stages. The input amplification stage is comprised of a positive-side amplifier circuit with a positive input signal voltage range with respect to the common voltage Vcom, a negative amplifier circuit with a negative input signal voltage range with respect to the common voltage Vcom, and a first switch SW20 and a second switch SW21 which are for selecting the operation of either the positive-side or negative-side amplifier circuit by a select signal POL for choosing whether to input the output of the positive- or negative-side amplifier circuit.

The positive-side amplifier circuit comprises a first differential transistor pair comprised of Ore transistors Mn41, Mn42, a first current source Ib1 supplying a tail current to the first differential transistor pair, and a first current mirror circuit fabricated by transistors Mp44, Mp45, whose current input terminal and current output terminal are connected to the two output terminals (the drains of the transistors Mn41, Mn42) of the first differential transistor pair. Similarly, the negative-side amplifier circuit comprises a second differential transistor pair comprised of transistors Mp41, Mp42, a second current source Lb2 supplying a tail current to the second differential transistor pair, and a second current mirror circuit fabricated by transistors Mn44, Mn45 whose current input terminal and current output terminal are connected to the two output terminals (the drains of the transistors Mp41, Mp42) of the second differential transistor pair.

The first switch SW20 is connected between the two output terminals of the first differential transistor pair and the second switch SW21 is connected between the two output terminals of the second differential transistor pair.

The output amplification stage is comprised of transistors Mp43, Mn43 and the resistor circuit is comprised of a resistor Rf.

A case where the output of the negative-side D/A converter is inputted to the negative-side amplifier circuit is first considered to explain the operation of the two-input amplifier circuit shown in FIG. 31. In this case, the select signal POL is set at "0", which turns on the switch SW20 and turns off the switch SW21. Although the output voltage of the positive-side D/A converter is unstable, because it is higher than the common voltage Vcom, the transistor Mn42 is on even when the gate voltage of the transistor Mn41 or the output voltage of the output amplification stage in the amplifier circuit is lower than Vcom. Because the switch SW20 is on, the transistor Mp45 is in diode connection.

The current supplied from the current source Ib1 flows via one or both of the transistors Mn42, Mn41 into the transistors Mp44, Mp45 in diode connection. Then, a current generated according to the ratio of a size twice the size of $(W/L)_{Mp44,45}$ of the transistors Mp44, Mp45 to the size $(W/L)_{Mp43}$ of the transistor Mp43 is supplied from the transistor Mp3 as the bias current to the output amplification stage.

Specifically, when the output of the negative-side D/A converter is inputted, the amplifier circuit operates in the circuit connection of FIG. 31. The circuit connection of FIG. 31 is the same as that of FIG. 7 except for the way of supplying a bias current to the output amplification stage 3. It is clear that a stable operation can be realized by the resistor Rf without using a phase compensation capacitance. As a result, the chip area required for a phase compensation capacitance is reduced, helping cut production costs.

When the output of the positive-side D/A converter is inputted, the p-channel MOS transistors are only replaced with n-channel MOS transistors and the n-channel MOS transistors are only replaced with p-channel MOS transistors. The basic operation is the same as when the output of the negative-side D/A converter is inputted.

Use of the switch to short-circuit the outputs of the differential transistor pair in the inactive amplifier circuit enables the bias current at the output stage to be set easily.

Figure 33:
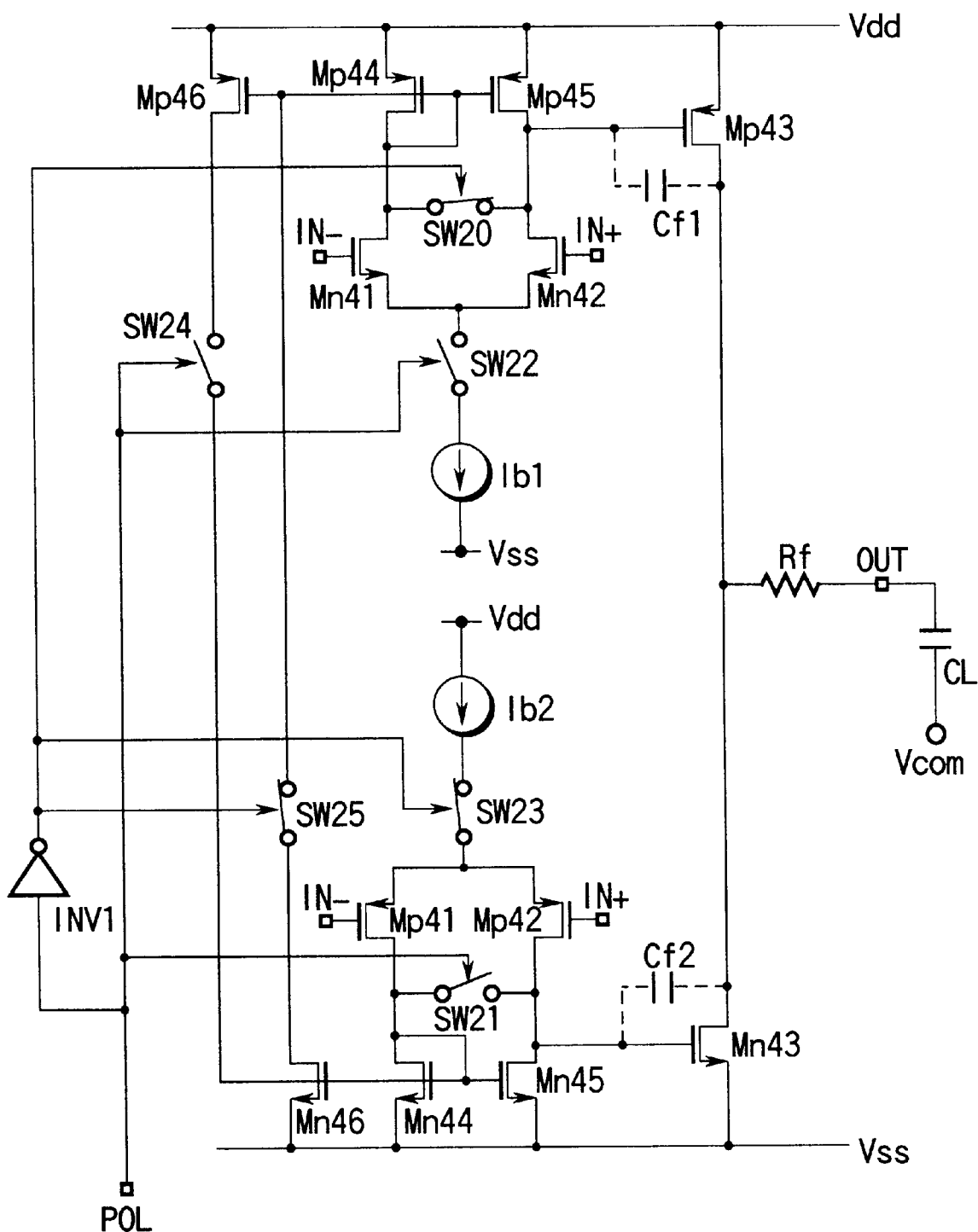
FIG. 33 is a seventeenth concrete example of an amplifier circuit according to a modification of the amplifier circuit of FIG. 31.

FIG. 33 is a sixteenth concrete example of an amplifier circuit related to a modification of FIG. 31. In FIG. 33, a transistor Mp46 for generating a current to adaptively supply a bias current to the output amplification stage referring to the current in the transistor Mp44 is added to the first current mirror circuit in the positive-side amplifier circuit. A transistor Mn46 for generating a current to adaptively supply a bias current to the output amplification stage referring to the current in the transistor Mn4 is added to the second current mirror circuit in the negative-side amplifier circuit.

Furthermore, the following switches are added: a third and a fourth switch SW22, SW23 for on and off control of the current sources Ib1, Ib2 in the positive-side and negative-side amplifier circuits, a fifth switch SW24 inserted between the drain of the transistor Mp46 or the second current output terminal of the first current mirror circuit and the current input terminal of the second current mirror circuit, and a sixth switch SW26 inserted between the drain of the transistor Mn46 or the second current output terminal of the second current mirror circuit and the current input terminal of the first current mirror circuit. The added switches SW22 to SW26 are controlled by the select signal POL as the switches SW20, SW21 are.

The output amplification stage is comprised of transistors Mp43, Mn43 and the resistor circuit is comprised of a resistor Rf.

A case where the output of the negative-side D/A converter is inputted to the negative-side amplifier circuit is first considered to explain the operation of the two-input amplifier circuit shown in FIG. 33. In this case, the select signal POL is set at "0", which turns on the switches SW20, SW23, and SW25 and turns off the switches SW21, SW22, and SW24. Because the switch SW22 is off, the current supplied from the current source Ib1 does not flow through the transistors Mn41, Mn42, turning off the differential input transistors Mn48, Mn42 constituting the positive-side amplifier circuit. Moreover, because the switch SW23 is on, the current supplied from the current source Ib2 flows through the transistors Mp41, Mp42, causing the negative-side amplifier circuit to operate.

Then, the transistor Mn46 generates a current referring to the current flowing through the transistor Mn44. The current passes through the on switch SW25 and the on switch SW20 and flows into the transistors Mp45, Mp44 in diode connection. Then, a current generated according to the ratio of a size twice the size $(W/L)_{Mp44,45}$ of the transistors Mp44, Mp45 to the size $(W/L)_{Mp43}$ of the transistor Mp43 is supplied from the transistor Mp3 as the bias current to the output amplification stage. Namely, when the output of the negative-side D/A converter is inputted, the amplifier circuit operates in the circuit connection shown in FIG. 34.

Figure 34:
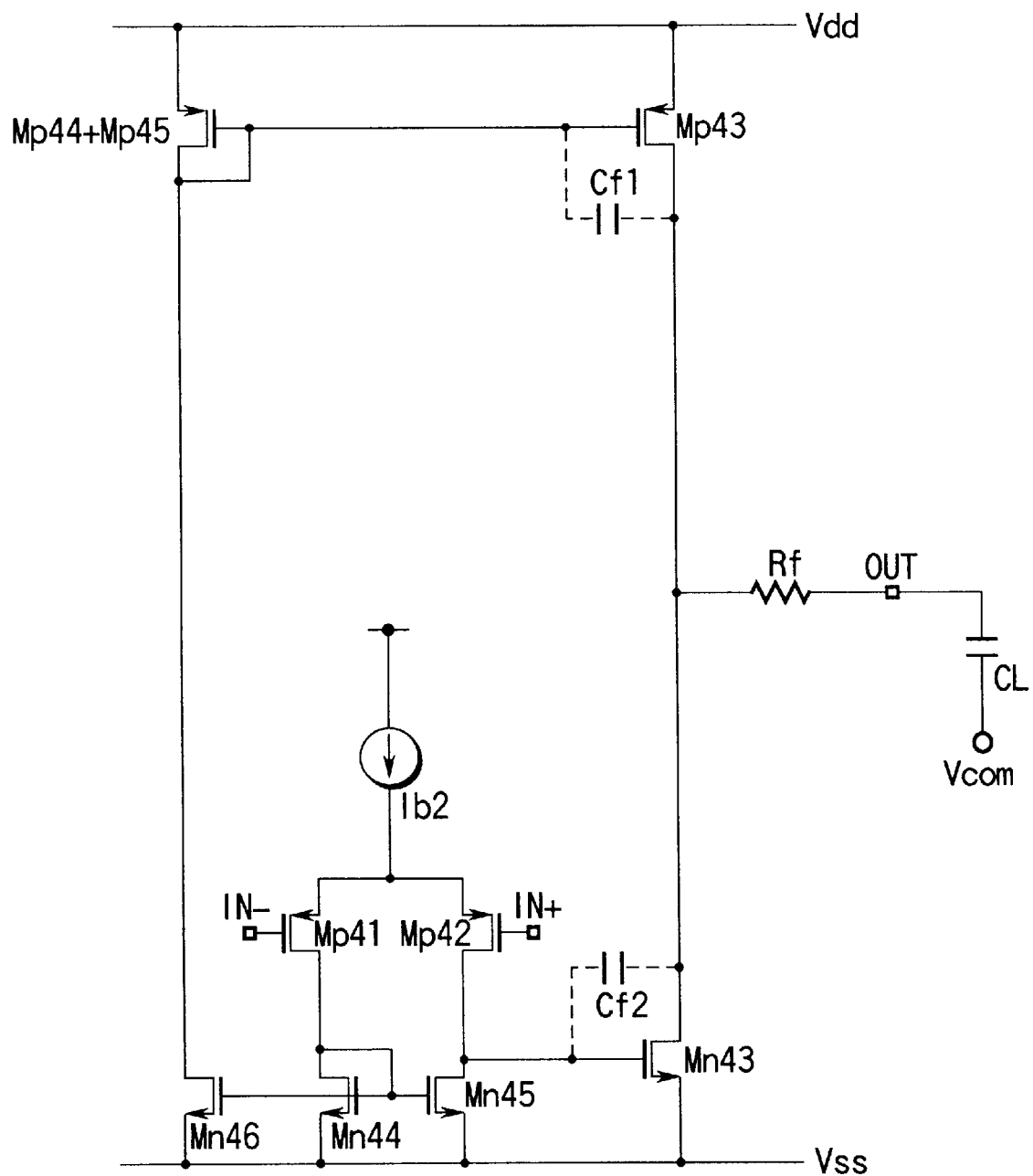
FIG. 34 is a circuit diagram to help explain the operation of the amplifier circuit of FIG. 33.

Namely, when the amplifier circuit in the circuit connection of FIG. 34 is in the steady state, or when the positive and negative input signal voltages in the negative-side amplifier circuit balance each other, a current half of the bias current from the current source Ib2 in the negative-side amplifier circuit is generated according to the $(W/L)_{Mp44}:(W/L)_{Mp46}$ ratio of the size (W/L) of transistor Mn44 to that of transistor Mn46. The generated current is amplified according to the ratio of the a size twice the size $(W/L)_{Mp44,45}$ of the transistors Mp44, Mp45 to the size $(W/L)_{Mp43}$ of the transistor Mp43 is supplied from the transistor Mp43 as the bias current to the output amplification stage. Except for this, the circuit connection of FIG. 34 is the same as that of FIG. 7. As explained in FIGS. 7 to 9, it is clear that use of the resistor Rf realizes a stable operation.

In a transitional state where the positive-side input of the negative-side amplifier circuit is larger than the negative-side input, because all of the bias current from the current source Ib2 flows through the transistor Mp41 into the transistor Mn44 the bias current to the output amplification stage supplied from the transistor Mp43 can be made twice the current in the steady state. This makes it possible to double the improvement in the rising characteristic determined by transistor Mp43 and the load capacitor without increasing the power consumption in the steady state.

In a transitional state where the positive-side of the negative-side amplifier circuit is smaller the negative-side input, all of the bias current from the current source Ib2 flows into the transistor Mp42 and no current flows through the transistor Mn44. As a result, the bias current to the output amplification stage supplied from the transistor Mp43 becomes zero, reducing the current flowing from the transistor Mp43 through the transistor Mn43, which reduces the power consumption.

When the output of the positive-side D/A converter is inputted, the p-channel MOS transistors are only replaced with n-channel MOS transistors and the n-channel MOS transistors are only replaced with p-channel MOS transistors. The basic operation is the same as when the output of the negative-side D/A converter is inputted.

As described above, use of the resistor Rf realizes a stable operation of the amplifier circuit without a phase compensation capacitance. This not only decreases the chip area but also doubles the rising or falling transitional characteristic without increasing the power consumption in the steady state.

Figure 35:
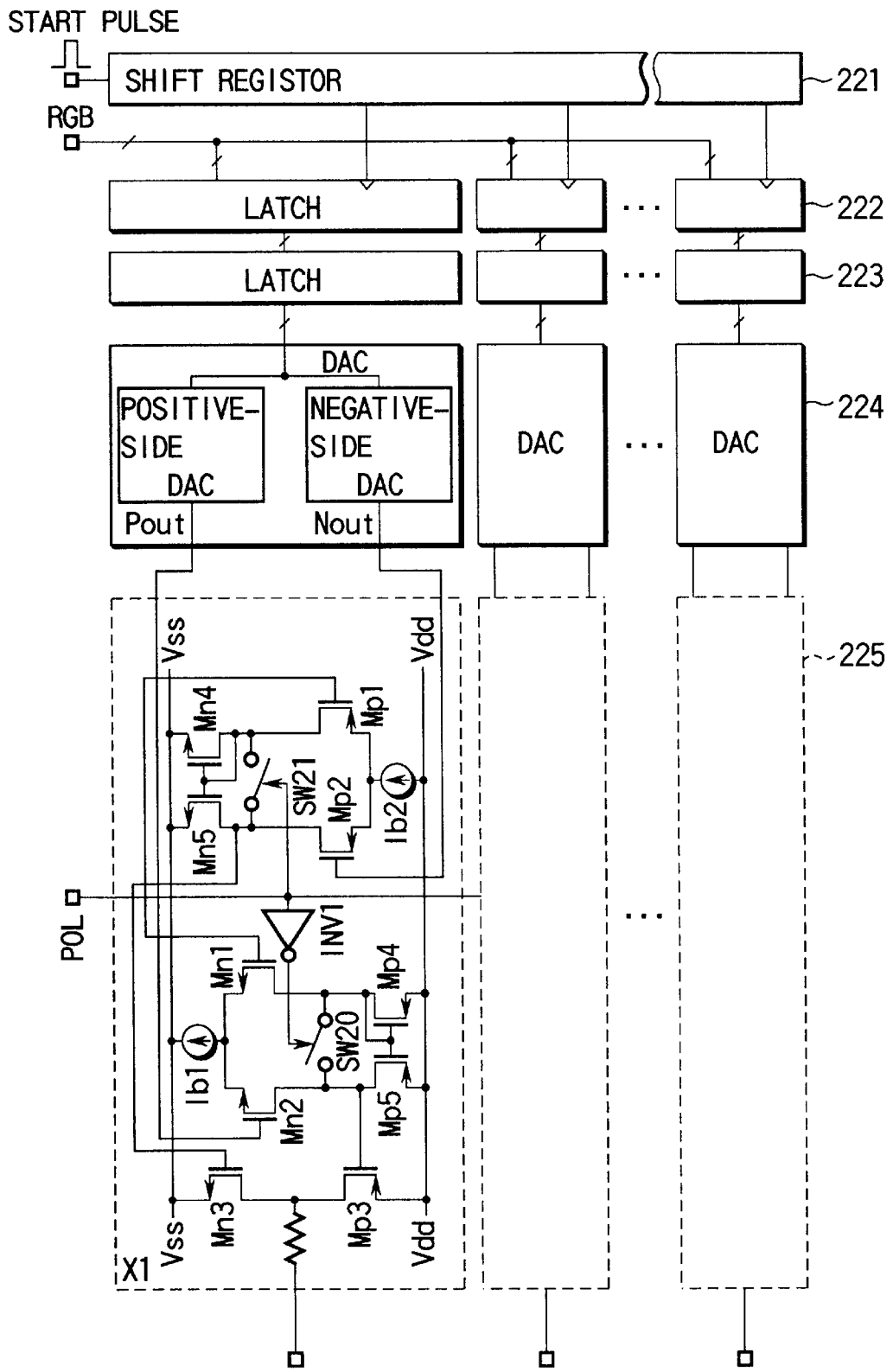
FIG. 35 is a circuit diagram of a liquid-crystal display driving circuit to which the amplifier circuit of FIG. 33 has been applied.
Figure 36:
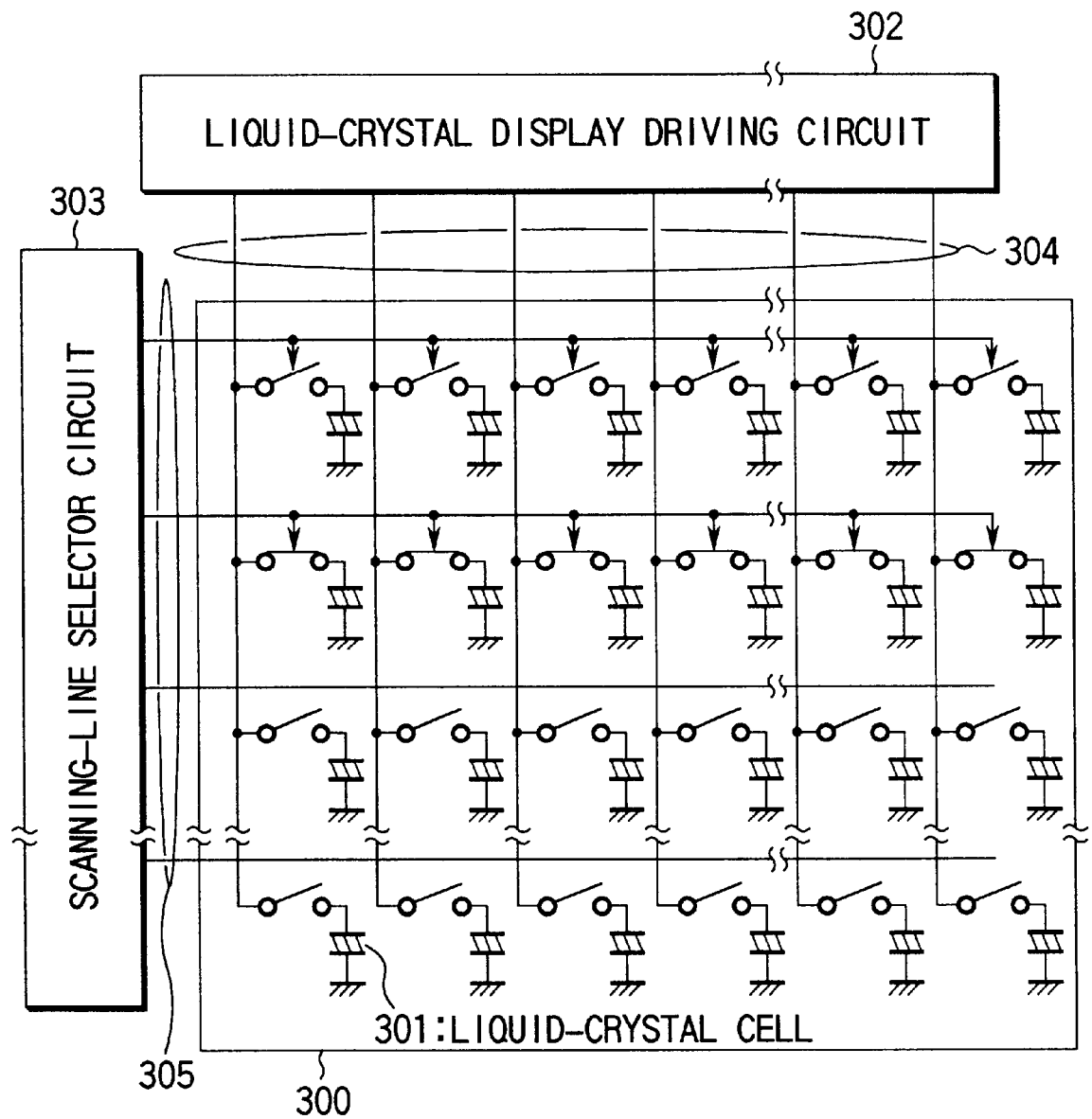
FIG. 36 shows the configuration of a liquid-crystal display unit.

FIG. 35 shows the configuration of a liquid-crystal display driving circuit which is used in a liquid-crystal display unit shown in FIG. 36 and to which an amplifier circuit of the present invention has been applied.

The liquid-crystal display unit of FIG. 36 comprises a liquid-crystal display panel 300, a liquid-crystal driving circuit 302 for driving the liquid-crystal display panel 300 by supplying image signals to signal lines 304, and a scanning-line selector circuit 303 for selectively driving scanning lines 305. In the liquid-crystal display panel, liquid-crystal cells 301 are arranged in a matrix and the signal lines 304 to which image signals are supplied and the scanning lines are provided in such a manner that the former intersect the latter.

As shown in FIG. 35, the display driving circuit comprises as many latches 222 as the number of pixels needed for a single horizontal line to store a RGB signal, a shift register 221 for transferring timing pulses to latch RGB, a latch 223 for further storing the RGB signal stored in the latches 222 at intervals of one horizontal duration, a D/A converter 224 for converting the RGB signal of one horizontal line stored in the latch 223 into analog values, and a driving circuit 225 for receiving the RGB signal converted by the D/A converter 224 into an analog voltage and driving the signal lines and liquid-crystal cells of the liquid-crystal display panel.

An amplifier circuit 225 is a fifteenth concrete example of the amplifier circuit of FIG. 31. As explained in FIG. 31, the amplifier circuit 255 does not necessarily require a phase compensation capacitance to stabilize the operation.

While in FIG. 35, the amplifier circuit in the example of FIG. 31 has been applied to the driving circuit 225, the amplifier circuit in each of the other examples may be applied to the driving circuit 225.

While in the embodiments, the amplifier circuits comprised of MOS transistors have been explained, the amplifier circuits may be comprised of bipolar transistors in place of the MOS transistors. In that case, the gate is replaced with the base, the source is replaced with the emitter, and the drain is replaced with the collector. Furthermore, W/L is replaced with the emitter area.

As explained above, with the present invention, in an amplifier circuit having at least an input amplification stage and an output amplification stage, insertion of a resistor circuit between the output terminal of the output amplification stage and the signal output terminal of the amplifier circuit eliminates the need for a phase compensation capacitance necessary to stabilize the operation in a conventional amplifier circuit or reduces the phase compensation capacitance remarkably. This decreases the chip area in the process of integration and reduces production costs, which provides a low-cost stable amplifier circuit.

Applying an amplifier circuit of the invention to an integrated liquid-crystal display driving circuit reduces the cost of the liquid-crystal display unit.

In conventional phase compensation, since the pole frequency was proportional to the transconductance at the output amplification stage in the case of a large capacitive load, the phase margin was improved by increasing the current at the output amplification stage. This, however, resulted in an increase in the power consumption. In contrast, with the present invention, the transconductance is not directly related to the frequencies of poles, which achieves phase compensation with low power consumption.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An amplifier circuit comprising:
   a plurality of amplification stages cascade-connected between a signal input terminal to which an input signal is supplied and a signal output terminal to which a capacitive load is connected and including at least an input amplification stage and an output amplification stage having an output terminal; and
   a resistor circuit including at least a resistor inserted between the output terminal of said output amplification stage and said signal output terminal, for introducing a zero into an open loop frequency characteristic to compensate a phase on said output amplification stage; wherein,
      said input amplification stage includes a positive-side amplifier circuit and a negative-side amplifier circuit to which a first and a second input signal changing to the positive side and negative side with respect to a specific common voltage are inputted,
      said positive-side amplifier circuit includes a first differential transistor pair to which said first input signal is inputted, a first current source configured to supply a tail current to the first differential transistor pair, a first current mirror circuit whose current input terminal and current output terminal are connected to the two output terminals of said first differential transistor pair, and a first switch provided between the two output terminals of said first differential transistor pair,
      said negative-side amplifier circuit includes a second differential transistor pair to which said second input signal is inputted, a second current source configured to supply a tail current to the second differential transistor pair, a second current mirror circuit whose current input terminal and current output terminal are connected to the two output terminals of said second differential transistor pair, and a second switch provided between the two output terminals of said second differential transistor pair,
      said first switch being brought into the off state and said second switch being brought into the on state when said first input signal is inputted to said positive-side amplifier circuit, and said first switch being brought into the on state and said second switch being brought into the off state when said second input signal is inputted to said negative-side amplifier circuit, and
      said output amplification stage includes a complementary transistor pair whose drains or collectors are connected to the output terminal of the output amplification stage, the gate or base of one of the complementary transistor pair being connected to one output terminal of said positive-side amplifier circuit and the gate or base of the other of the complementary transistor pair being connected to one output terminal of said negative-side amplifier circuit.

2. An amplifier circuit comprising:
   a plurality of amplification stages cascade-connected between a signal input terminal to which an input signal is supplied and a signal output terminal to which a capacitive load is connected and including at least an input amplification stage and an output amplification stage having an output terminal; and
   a resistor circuit including at least a resistor inserted between the output terminal of said output amplification stage and said signal output terminal, to introduce a zero into an open loop frequency characteristic to compensate a phase on said output amplification stage; wherein,
      said input amplification stage includes a positive-side amplifier circuit and a negative-side amplifier circuit to which a first and a second input signal changing to the positive side and negative side with respect to a specific common voltage are inputted,
      said positive-side amplifier circuit includes a first differential transistor pair to which said first input signal is inputted, a first current source configured to supply a tail current to the first differential transistor pair, a first current mirror circuit whose current input terminal and first current output terminal are connected to the two output terminals of said first differential transistor pair, a first switch provided between the two output terminals of said first differential transistor pair, and a third switch for turning on and off said first current source,
      said negative-side amplifier circuit includes a second differential transistor pair to which said second input signal is inputted, a second current source configured to supply a tail current to the second differential transistor pair, a second current mirror circuit whose current input terminal and first current output terminal are connected to the two output terminals of said second differential transistor pair, a second switch provided between the two output terminals of second differential transistor pair and a fourth switch for turning on and off said second current source,
      a second current output terminal of said first current mirror circuit being connected via a fifth switch to the current input terminal of said second current mirror circuit and a second current output terminal of said second current mirror circuit being connected via a sixth switch to the current input terminal of said first current mirror circuit,
      said first, fourth, and sixth switches being brought into the off state and said second, third, and fifth switches being brought into the on state when said first input signal is inputted to said positive-side amplifier circuit, and said first, fourth, and sixth switches being brought into the on state and said second, third, and fifth switches being brought into the off state when said second input signal is inputted to said negative-side amplifier circuit, and
      said output amplification stage includes a complementary transistor pair whose drains or collectors are connected to the output terminal of the output amplification stage, the gate or base of one of the complementary transistor pair being connected to one output terminal of said positive-side amplifier circuit and the gate or base of the other output terminal of the complementary transistor pair being connected to one output terminal of said negative-side amplifier circuit.

3. An amplifier circuit comprising:

a plurality of amplification stages cascade-connected between a signal input terminal to which an input signal is supplied and a signal output terminal to which a capacitive load is connected and including at least an input amplification stage and an output amplification stage having an output terminal; and a resistor circuit including at least a resistor inserted between the output terminal of said output amplification stage and said signal output terminal, configured to introduce a zero into an open loop frequency characteristic to compensate a phase on said output amplification stage, wherein, said input amplification stage includes a first input circuit comprised of a first conductivity type transistor connected to the signal input terminal and a second input circuit comprised of a second conductivity type transistor, and which further includes a feedforward circuit including at least a capacitive element which is provided from one of a source and a drain of one of the first and the second conductivity type transistor to said output amplification stage.

4. An amplifier circuit according to claim 3, wherein said output amplification stage is comprised of a first and a second transistor which have gates for receiving signals, the drain of said first transistor being connected to said signal output terminal, the source of said first transistor being connected to the drain of said second transistor, the source of said second transistor being connected to a first power supply, and the connection node of the source of said first transistor and the drain of said second transistor being connected to the output of said feedforward circuit.

5. An amplifier circuit according to claim 3, wherein said power supply configured to supply a bias current to said output amplification stage is comprised of a resistive element and a third transistor with a gate to which the bias voltage is applied via the resistive element, the connection node of said resistive element and the gate of said third transistor being connected to said feedforward circuit.

6. An amplifier circuit according to claim 3, further comprising a sensing device configured to sense that the input signal voltage inputted to said signal input terminal has changed to a specific polarity and controlling the bias current o said output amplification stage.

7. An amplifier circuit according to claim 5, wherein said resistive element is comprised of a field-effect transistor with a specific on-resistance.

8. A liquid-crystal display unit, comprising:

a liquid-crystal display including plural liquid-crystal cells, signal lines for selectively applying a signal voltage according to an image signal to each of said liquid-crystal cells, and scanning lines intersecting the signal lines;

a driving circuit for driving said signal lines according to an image signal; and a selector circuit for selecting said scanning lines in sequence, wherein said driving circuit includes an amplifier circuit comprising a plurality of amplification stages, that are cascade-connected between a signal input terminal signal to which an input signal is supplied and a signal output terminal to which the liquid-crystal cells are selectively connected via the signal lines and that includes at least an input amplification stage and an output amplification stage having an output terminal, and a resistor circuit including at least a resistor inserted between the output terminal of said output amplification stage and said signal output terminal, configured to introduce a zero into an open loop frequency characteristic to compensate a phase on said output amplification stage; wherein, said input amplification stage includes a positive-side amplifier circuit and a negative-side amplifier circuit to which a first and a second input signal changing to the positive side and negative side with respect to a specific common voltage are inputted, said positive-side amplifier circuit includes a first differential transistor pair to which said first input signal is inputted, a first current source configured to supply a tail current to the first differential transistor pair, a first current mirror circuit whose current input terminal and current output terminal are connected to the two output terminals of said first differential transistor pair, and a first switch provided between the two output terminals of said first differential transistor pair, said negative-side amplifier circuit includes a second differential transistor pair to which said second input signal is inputted, a second current source configured to supply a tail current to the second differential transistor pair, a second current mirror circuit whose current input terminal and current output terminal are connected to the two output terminals of said second differential transistor a pair, and a second switch provided between the two output terminals of said second differential transistor pair, said first switch being brought into the off state and said second switch being brought into the on state when said first input signal is inputted to said positive-side amplifier circuit, and said first switch being brought into the on state and said second switch being brought into the off state when said second input signal is inputted to said negative-side amplifier circuit, and said output amplification state includes a complementary transistor pair whose drains or collectors are connected to the output terminal of the output amplification stage, the gate or base of one of the complementary transistor pair being connected to one output terminal of said positive-side amplifier circuit and the gate or base of the other of the complementary transistor pair being connected to one output terminal of said negative-side amplifier circuit.

9. A liquid-crystal display unit comprising:

a liquid-crystal display including plural liquid-crystal cells, signal lines configured to selectively apply a signal voltage according to an image signal to each of said liquid-crystal cells, and scanning lines intersecting the signal lines;

a driving circuit configured to drive said signal lines according to an image signal; and a selector circuit configured to select said scanning lines in sequence, wherein said driving circuit includes an amplifier circuit comprising a plurality of amplification stages, that are cascade-connected between a signal input terminal signal to which an input signal is supplied and a signal output terminal to which the liquid-crystal cells are selectively connected via the signal lines and that includes at least an input amplification stage and an output amplification stage having an output terminal, and a resistor circuit including at least a resistor inserted between the output terminal of said output amplification stage and said signal output terminal, configured to introduce a zero into an open loop frequency characteristic to compensate a phase on said output amplification stage; wherein, said input amplification stage includes a positive-side amplifier circuit and a negative-side amplifier circuit to which a first and a second input signal changing to the positive side and negative side with respect to a specific common voltage are inputted, said positive-side amplifier circuit includes a first differential transistor pair to which said first input signal is inputted, a first current source configured to supply a tail current to the first differential transistor pair, a first current mirror circuit whose current input terminal and first current output terminal are connected to the two output terminals of said first differential transistor pair, a first switch provided between the two output terminals of said first differential transistor pair, and a third switch configured to turn on and off said first current source, said negative-side amplifier circuit includes a second differential transistor pair to which said second input signal is inputted, a second current source configured to supply a tail current o the second differential transistor pair, a second current mirror circuit whose current input terminal and first current output terminal are connected to the two output terminals of said second differential transistor pair, a second switch provided between the two output terminals of said second differential transistor pair, and a fourth switch configured to turn on and off said second current source, a second current output terminal of said first current mirror circuit being connected via a fifth switch to the current input terminal of said second current mirror circuit and a second current output terminal of said second current mirror circuit being connected via a sixth switch to the current input terminal of said first current mirror circuit, and said first, fourth, and sixth switches being brought into the off state and said second, third, and fifth switches being brought into the on state when said first input signal is inputted to said positive-side amplifier circuit, and said first, fourth, and sixth switches being brought into the on state and said second, third, and fifth switches being brought into the off state when said second input signal is inputted to said negative-side amplifier circuit, and said output amplification stage includes a complementary transistor pair whose drains or collectors are connected to the output terminal of the output amplification stage, the gate or base of one of the complementary transistor pair being connected to one output terminal of said positive-side amplifier circuit and the gate or base of the other output terminal of the complementary transistor pair being connected to one output terminal of said negative-side amplifier circuit.

10. An amplifier circuit including a signal input terminal, a signal output terminal and a plurality of amplifiers which are configured to drive a plurality of capacitive loads and integrated in a chip, the amplifier circuit comprising:

a plurality of amplification stages including at least an input amplification stage and an output amplification stage which are cascade-connected between the signal input terminal and the signal output terminal; and a resistor circuit including at least one resistor connected between an output terminal of the output amplification stage and the signal output terminal, to make a frequency of a second pole appearing in an open loop frequency characteristic of the amplifier circuit lower than a frequency at which a gain of the amplifier circuit is 1, and a frequency of a first zero point appearing in the open loop frequency characteristic lower than the frequency at which the gain of the amplifier circuit is 1;

wherein the input amplification stage includes a positive-side amplifier and a negative-side amplifier configured to receive a first input signal and a second input signal which change to a positive polarity and a negative polarity in relation to a specific common voltage, the positive-side amplifier comprising a first differential transistor pair to which the first input signal inputs, a first current source configured to supply a tail current to the first differential transistor pair, a first current mirror having a current input terminal and a current output terminal connected to two output terminals of the first differential transistor pair and a first switch connected between the two output terminals of the first differential transistor pair, the negative-side amplifier comprising a second differential transistor pair to which the second input signal inputs, a second current source configured to supply a tail current to the second differential transistor pair, a first current mirror having a current input terminal and a current output terminal connected to two output terminals of the second differential transistor pair and a second switch connected between the two output terminals of the second differential transistor pair, comprising when the first input signal inputs to the positive-side amplifier, the first switch being rendered OFF and the second switch being rendered ON, when the second input signal inputs to the negative-side amplifier, the first switch being rendered ON and the second switch being rendered OFF, and the output amplification stage comprising a complementary transistor pair whose drains or collectors are connected in common to the output terminal of the output amplification stage, a gate or base of one of the complementary transistor pair being connected to one output terminal of the positive-side amplifier and a gate or base of the other of the complementary transistor pair being connected to one output terminal of the negative-side amplifier.

11. An amplifier circuit including a signal input terminal, a signal output terminal and a plurality of amplifiers which are configured to drive a plurality of capacitive loads and integrated in a chip, the amplifier circuit comprising:

a plurality of amplification stages including at least an input amplification stage and an output amplification stage which are cascade-connected between the signal input terminal and the signal output terminal; and a resistor circuit including at least one resistor connected between an output terminal of the output amplification stage and the signal output terminal, to make a frequency of a second pole appearing in an open loop frequency characteristic of the amplifier circuit lower than a frequency at which a gain of the amplifier circuit is 1, and a frequency of a first zero point appearing in the open loop frequency characteristic lower than the frequency at which the gain of the amplifier circuit is 1;

wherein the input amplification stage includes a positive-side amplifier and negative-side amplifier configured to receive a first input signal and a second input signal which change to a positive polarity and a negative polarity in relation to a specific common voltage, the positive-side amplifier comprising a first differential transistor pair to which the first input signal inputs, a first current source configured to supply a tail current to the first differential transistor pair, a first current mirror having a current input terminal and a current output terminal connected to two output terminals of the first differential transistor pair, a first switch connected between the two output terminals of the first differential transistor pair and a third switch configured to make the first current source ON or OFF, the negative-side amplifier comprising a second differential transistor pair to which the second input signal inputs, a second current source configured to supply a tail current to the second differential transistor pair, a first current mirror having a current input terminal and a current output terminal connected to two output terminals of the second differential transistor pair, a second switch connected between the two output terminals of the second differential transistor pair and a fourth switch configured to make the second current source ON or OFF, a second current terminal of the first current mirror being connected to the current input terminal of the second current mirror via a fifth switch, a second current output terminal of the second current mirror being connected to the current input terminal of the first current mirror via a sixth switch, when the first input signal inputs to the positive-side amplifier, the first, fourth and sixth switches being rendered OFF and the second, third and fifth switches being rendered ON, when the second input signal inputs to the negative-side amplifier, the first, fourth and sixth switches being rendered ON and the second, third and fifth switches being rendered OFF, and the output amplification stage comprising a complementary transistor pair whose drains or collectors are connected in common to the output terminal of the output amplification stage, a gate or base of one of the complementary transistor pair being connected to one output terminal of the positive-side amplifier and a gate or base of the other of the complementary transistor pair being connected to one output terminal of the negative-side amplifier.

12. An amplifier circuit including a signal input terminal, a signal output terminal and a plurality of amplifiers which are configured to drive a plurality of capacitive loads and integrated in a chip, the amplifier circuit comprising:

a plurality of amplification stages including at least an input amplification stage and an output amplification stage which are cascade-connected between the signal input terminal and the signal output terminal; and a resistor circuit including a plurality of resistors connected between an output terminal of the output amplification stage and the signal output terminal, at least one resistor selected from the resistors being connected between the output amplification stage and the signal output terminal to make a frequency of a second pole appearing in an open loop frequency characteristic of the amplifier circuit lower than a frequency at which a gain of the amplifier circuit is 1, and a frequency of a first point appearing in the open loop frequency characteristic lower than the frequency at which the gain of the amplifier circuit is 1;

wherein the input amplification stage includes a positive-side amplifier and a negative-side amplifier configured to receive a first input signal and a second input signal which change to a positive polarity and a negative polarity in relation to a specific common voltage, comprising the positive-side amplifier comprising a first differential transistor pair to which the first input signal inputs, a first current source configured to supply a tail current to the first differential transistor pair, a first current mirror having a current input terminal and a current output terminal connected to two output terminals of the first differential transistor pair and a first switch connected between the two output terminals of the first differential transistor pair, the negative-side amplifier comprising a second differential transistor pair to which the second input signal inputs, a second current source configured to supply a tail current to the second differential transistor pair, a first current mirror having a current input terminal and a current output terminal connected to two output terminals of the second differential transistor pair and a second switch connected between the two output terminals of the second differential transistor pair, when the first input signal inputs to the positive-side amplifier, the first switch being rendered OFF and the second switch being rendered ON, when the second input signal inputs to the negative-side amplifier, the first switch being rendered ON and the second switch being rendered OFF, and the output amplification stage comprising a complementary transistor pair whose drains or collectors are connected in common to the output terminal of the output amplification stage, a gate or base of one of the complementary transistor pair being connected to one output terminal of the positive-side amplifier and a gate or base of the other of the complementary transistor pair being connected to one output terminal of the negative-side amplifier.

13. An amplifier circuit including a signal input terminal, a signal output terminal and a plurality of amplifiers which are configured to drive a plurality of capacitive loads and integrated in a chip, the amplifier circuit comprising:

a plurality of amplification stages including at least an input amplification stage and an output amplification stage which are cascade-connected between the signal input terminal and the signal output terminal; and a resistor circuit including a plurality of resistors connected between an output terminal of the output amplification stage and the signal output terminal, at least one resistor selected from the resistors being connected between the output amplification stage and the signal output terminal to make a frequency of a second pole appearing in an open loop frequency characteristic of the amplifier circuit lower than a frequency at which a gain of the amplifier circuit is 1, and a frequency of a first point appearing in the open loop frequency characteristic lower than the frequency at which the gain of the amplifier circuit is 1;

wherein the input amplification stage includes a positive-side amplifier and a negative-side amplifier configured to receive a first input signal and a second input signal which change to a positive polarity and a negative polarity in relation to a specific common voltage, the positive-side amplifier comprising a first differential transistor pair to which the first input signal inputs, a first current source configured to supply a tail current to the first differential transistor pair, a first current mirror having a current input terminal and a current output terminal connected to two output terminals of the first differential transistor pair, a first switch connected between the two output terminals of the first differential transistor pair and a third switch configured to make the first current source ON or OFF, the negative-side amplifier comprising a second differential transistor pair to which the second input signal inputs, a second current source configured to supply a tail current to the second differential transistor pair, a first current mirror having a current input terminal and a current output terminal connected to two output terminals of the second differential transistor pair, second switch connected between the two output terminals of the second differential transistor pair and a fourth switch configured to make the second current source ON or OFF, a second current terminal of the first current mirror being connected to the current input terminal of the second current mirror via a fifth switch, a second current output terminal of the second current mirror being connected to the current input terminal of the first current mirror via a sixth switch, when the first input signal inputs to the positive-side amplifier, the first, fourth and sixth switches being rendered OFF and the second, third and fifth switches being rendered ON, when the second input signal inputs to the negative-side amplifier, the first, fourth and sixth switches being rendered ON and the second, third and fifth switches being rendered OFF, and the output amplification stage comprising a complementary transistor pair whose drains or collectors are connected in common to the output terminal of the output amplification stage, a gate or base of one of the complementary transistor pair being connected to one output terminal of the positive-side amplifier and a gate or base of the other of the complementary transistor pair being connected to one output terminal of the negative-side amplifier.

* * * * *